US008890728B2

(12) United States Patent
Le Dortz et al.

(10) Patent No.: US 8,890,728 B2
(45) Date of Patent: Nov. 18, 2014

(54) METHOD AND DEVICE FOR USE WITH ANALOG TO DIGITAL CONVERTER

(71) Applicant: STMicroelectronics SA, Montrouge (FR)

(72) Inventors: Nicolas Le Dortz, Grenoble (FR); Thierry Simon, Grenoble (FR); Pascal Urard, Theys (FR); Caroline Lelandais-Perrault, Gif-sur-Yvette (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/179,993

(22) Filed: Feb. 13, 2014

(65) Prior Publication Data

US 2014/0232575 A1     Aug. 21, 2014

(30) Foreign Application Priority Data

Feb. 20, 2013   (FR) ..................................... 13 51448

(51) Int. Cl.
   *H03M 1/06*   (2006.01)
   *H03M 1/12*   (2006.01)
   *H03M 1/00*   (2006.01)

(52) U.S. Cl.
   CPC .......... *H03M 1/0624* (2013.01); *H03M 1/1225* (2013.01); *H03M 1/12* (2013.01); *H03M 1/00* (2013.01); *H03M 1/1215* (2013.01)
   USPC .......................................... 341/118; 341/141

(58) Field of Classification Search
   CPC ........ H03M 1/00; H03M 1/12; H03M 1/1225
   USPC .................. 341/118, 120, 155, 156, 141, 126
   See application file for complete search history.

(56) References Cited

U.S. PATENT DOCUMENTS 7,138,933 B2 * 11/2006 Nairn ............................ 341/141
7,403,875 B2    7/2008 Vogel et al.
8,159,377 B2    4/2012 Goldman et al.

FOREIGN PATENT DOCUMENTS

EP         2503696 A1    9/2012

OTHER PUBLICATIONS

Abbaszadeh, et al., "A New FPGA-Based Postprocessor Architecture for Channel Mismatch Correction of Time Interleaved ADCS," Signal Processing Systems, Oct. 7, 2009, 6 pages.
Divi, et al., "Blind Calibration of Timing Skew in Time-Interleaved Analog-to-Digital Converters," IEEE Journal of Selected Topics in Signal Processing, vol. 3, No. 3, Jun. 2009, 14 pages.

(Continued)

*Primary Examiner* — Joseph Lauture
(74) *Attorney, Agent, or Firm* — Slater & Matsil, L.L.P.

(57) ABSTRACT

According to one mode of implementation, a method includes an estimation including on the one hand a correlation processing involving at least one part of the sampled signal, at least one part of at least one first signal gleaned from a derived signal representative of a temporal derivative of the sampled signal and at least one part of N partial filtered signals respectively representative of N weighted differences between N pairs of bracketing versions flanking the sampled signal, N being greater than or equal to 1. On the other hand, the estimation includes a matrix processing on the results of this correlation processing. Correction processing of the M−1 trains involves respectively M−1 second signals gleaned from the derived signal and the suite of M−1 shift coefficients.

40 Claims, 15 Drawing Sheets

(56) References Cited

OTHER PUBLICATIONS

Elbornsson, et al., "Blind Adaptive Equalization of Mismatch Errors in a Time-Interleaved A/D Converter System," IEEE Transactions on Circuits and System—I: Regular Papers, vol. 51, No. 1, Jan. 2001, 8 pages.

Huang, et al., "A 10-bit 400-MS/s 36-mW Interleaved ADC," IEEE International Symposium on Radio-Frequency Integration Technology, Nov. 30-Dec. 2, 2011, Beijing, China, 4 pages.

Huang, et al., "Blind Calibration of Timing Offsets for Four-Channel Time-Interleaved ADCs," IEEE Transactions on Circuits and Systems—I: Regular Papers, vol. 54, No. 4, Apr. 2007, 14 pages.

Jamal, et al., "A 10-b 120-Msample/s Time-Interleaved Analog-to-Digital Converter With Digital Background Calibration," IEEE Journal of Solid-State Circuits, vol. 37, No. 12, Dec. 2002, 10 pages.

Oppenheim, et al., "Discrete-Time Differentiators," Prentice Hall, Inc. Jan. 1989, 4 pages.

Saleem, "Adaptive Blind Calibration of Gain and Timing Mismatches in a Time-Interleaved ADC-A Performance Analysis," Instrumentation and Measurement Technology Conference, May 13, 2012, 6 pages.

Shu, et al., "A 10~15-bit 60-MS/s Floating-Point ADC With Digital Gain and Offset Calibration," IEEE Journal of Solid-State Circuits, vol. 44, No. 9, Sep. 2009, 10 pages.

* cited by examiner

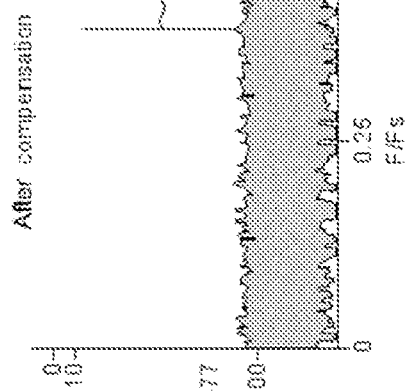
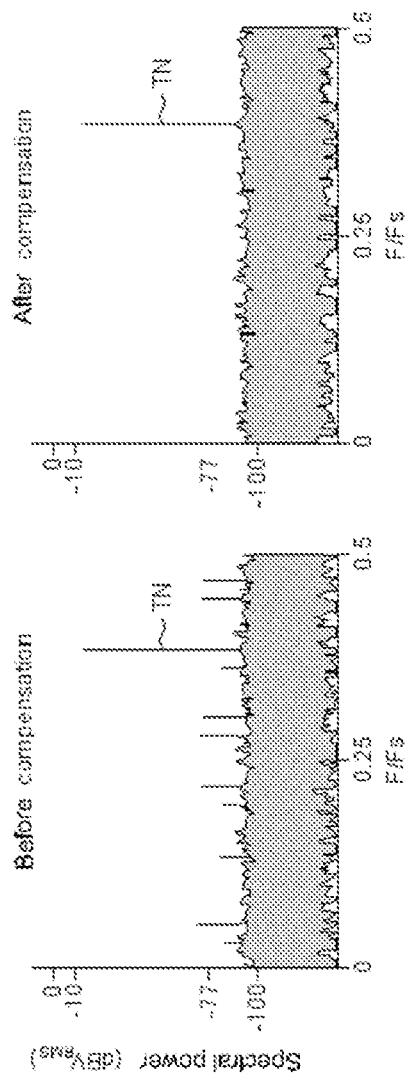
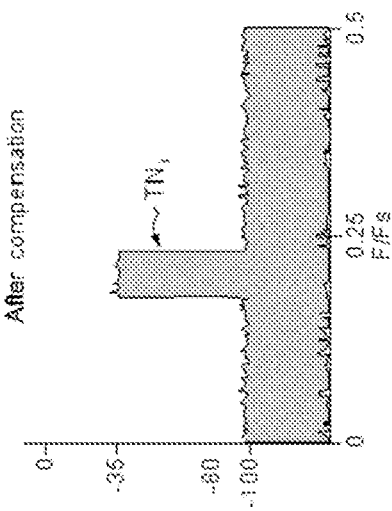
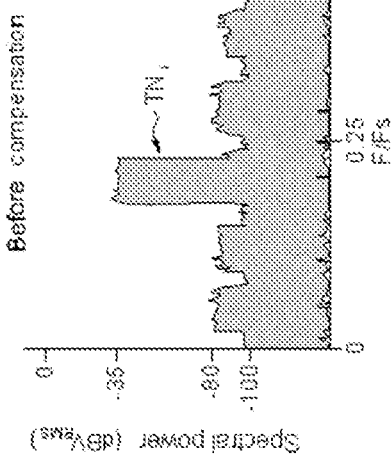

METHOD AND DEVICE FOR USE WITH ANALOG TO DIGITAL CONVERTER

This application claims the benefit of French Application No. 1351448, filed on Feb. 20, 2013, which application is hereby incorporated herein by reference.

TECHNICAL FIELD

The present invention relates generally to electronics circuits and methods, and, in particular embodiments, to a method and device for compensating the timing skew mismatch of several time interleaved analog to digital converters.

BACKGROUND

Certain applications require analog/digital converters exhibiting a high sampling frequency and high resolution. Among these applications are cable TV transmissions, optical communications, and satellite communications in which one or more modulated signals are transmitted simultaneously on a wide frequency band (for example several GHz wide).

Moreover the use of ever more complex modulations requires digitization of the signals on a large number of bits.

Architectures with a single converter struggle to satisfy the performance demanded at an acceptable cost in terms of consumption and surface area.

Hence, to make it possible to meet this need, structures with several analog/digital converters said to be "temporally interleaved" (TIADCs: Time-Interleaved Analog-to-Digital Converters) have established themselves. In such a time-interleaved structure the temporally interleaved analog/digital converters respectively perform temporally shifted analog/digital conversions of an analog signal. Stated otherwise, if the structure comprises M converters, the latter successively sample each in their turn the signal at a frequency equal to Fs/M, where Fs is the global frequency of sampling of the structure.

However the drawback of this type of structure resides in the fact that mismatches ("mispairings"), even slight ones, between the converters create spurious spectral lines or frequency bands that may be situated in the frequency zone of the useful signal. And in the case, for example, of television signals containing several channels, these spurious spectral lines or bands can disturb some of these channels.

These mismatches can have various causes, such as for example clock shifts ("timing skew") and possibly gains and/or shifts ("offset"), that differ between the converters of the structure.

A mismatch in terms of clock shift or gain adds to the frequency spectrum of the output signal attenuated spurious images of the frequency spectrum of the input signal around the frequencies that are multiples of Fs/M.

A mismatch in terms of shift ("offset") creates spurious spectral lines localized at frequencies that are multiples of Fs/M. Furthermore these shifts can vary over time.

SUMMARY

Embodiments of the invention relate to the processing of a sampled signal, for example, to the correction of this sampled signal so as in particular to correct the disparity of the clock shifts (known by the expression "timing skew mismatch") of several analog/digital converters of an analog/digital conversion system delivering this sampled signal.

Embodiments of the invention apply in particular but exclusively to the correction of the mismatch between the various values of the clock shifts of several analog/digital converters said to be "temporally interleaved", that is to say performing respectively temporally shifted analog/digital conversions of an analog signal so as to increase the global sampling frequency.

According to one mode of implementation and embodiment there is proposed a method and a device for processing a sampled signal arising from a structure of temporally interleaved converters making it possible to estimate the mismatch in terms of clock shifts of the converters, in particular in a simple and fast manner, without requiring a feedback loop or a calibration phase.

According to another mode of implementation and embodiment there is proposed a method and a device for processing a sampled signal arising from a structure of temporally interleaved converters furthermore making it possible to compensate the mismatch in terms of gain of the converters, in particular in a simple and fast manner.

According to another mode of implementation and embodiment there is proposed a method and a processing device also making it possible to estimate the shift value ("offset") of each analog/digital converter of the structure, to correct the values of the samples so as to take account of this estimated shift value in terms of voltage, and therefore to compensate the mismatch of these shifts, while spreading over the whole of the frequency spectrum, the residual frequency spectral lines resulting from the quantization of the corrected signal.

According to one aspect there is proposed a method for processing a sampled signal comprising M, M being greater than two, original trains of original samples respectively arising from M temporally interleaved converters, that is to say respectively performing temporally shifted analog/digital conversions of an analog signal.

The original trains of samples can be the trains of samples actually delivered as output from the converters, or else, if the trains delivered by the converters have undergone a prior processing, for example a compensation "of offset" and/or a compensation in terms of gain, trains arising from these trains delivered by the converters, for example the trains preprocessed by the compensation of offset and/or in terms of gain.

The method according to this aspect comprises a first processing comprising a selection of an original train in the guise of reference train, and for the M−1 other original trains, at least one estimation of a suite of M−1 shift coefficients respectively representative of clock shifts between these M−1 other original trains and the reference train.

The at least one estimation comprises on the one hand a correlation processing involving at least one part of the sampled signal, at least one part of at least one first signal gleaned from a sampled derived signal representative of a temporal derivative of the input signal and at least one part of N partial filtered signals respectively representative of N weighted differences between N pairs of bracketing versions flanking the sampled signal, N being greater than or equal to 1.

A pair of bracketing versions flanking the sampled signal comprises a version comprising, for each current sample of the signal, a $K^{th}$ sample following this current sample and a version of the signal comprising, for each current sample, a $K^{th}$ sample preceding this current sample.

The parts of the sampled signal, of the at least one first signal and of the filtered partial signal or signals on which the at least one correlation processing is performed can each comprise a group of L samples, for example a million samples, of the corresponding signal.

Thus for example each correlation of the correlation processing can comprise an average of L products of samples. This average can be a conventional average or any other type of average, for example a weighted average or else a modified moving average (MMA) of period L samples.

It is particularly simple during the correlation processing to use a single first signal comprising the samples of the derived signal that are associated with one of the M original trains. Indeed, although it is possible to use M first signals respectively comprising the samples of the derived signal that are associated with the M original trains and optionally thereafter to average the results obtained by the M correlations using these M first signals, it turns out that these M correlations are identical or almost identical.

Moreover in a simplified version, N can be equal to 1. In this case only a single pair of bracketing versions flanking the sampled signal is used, for example the two neighboring samples bracketing a current sample. That said, using several pairs of bracketing versions (N greater than 1) makes it possible to estimate the clock shifts (timing skew) by weighting the various useful frequency zones of the signal differently.

When N is greater than 1, N can be less than, equal to or greater than M.

According to this aspect the at least one estimation comprises on the other hand a matrix processing on the results of the correlation processing.

The method according to this aspect thus makes it possible to perform the estimation of the clock shifts of the converters in a forward ("direct") manner, that is to say without feedback correction of the original samples on the basis of information situated downstream of the point of reception of the original samples to be processed (corrected). This therefore requires just a single iteration, that is to say no feedback loop without risk of divergence nor necessity to provide a calibration phase. Therefore the hardware embodiment thereof is simplified and the estimation of the mismatch faster.

The compensation in terms of clock shifts advantageously comprises a correction of the sampled signal with the estimated shift coefficients.

Thus according to one mode of implementation, the first processing also comprises at least one processing for correcting the M−1 other original trains involving respectively M−1 second signals gleaned from the derived signal and the suite of M−1 estimated shift coefficients, so as to deliver M processed trains including the reference original train and M−1 corrected original trains.

The M−1 second signals thus comprise for example respectively the samples of the derived signal that are respectively associated with the M−1 other original trains.

The at least one correction processing can comprise a first-order Taylor approximation.

Such a correction processing performed on the sampled signal makes it possible to compensate the mismatch in terms of clock shifts at the tempo of arrival of the samples to be corrected.

That said, it would be possible as a variant to perform this compensation of the mismatch by correcting not the sampled signal but by acting for example at the level of the analog part of the converters by correcting the instants of sampling of the converters with the estimated values of the shift coefficients. This can be performed for example with the aid of adjustable delay circuits.

According to one mode of implementation the correlation processing comprises at least one set of N first correlations between the at least one part of the at least one first signal and at least one part of N third signals respectively gleaned from the N partial filtered signals, delivering at least one set of N first results of correlations.

Here again the N third signals advantageously comprise the samples of the N partial filtered signals associated with a single original train, for example the hereinabove mentioned said one of the M original trains (that is to say the original train associated with the first signal), and the correlation processing then comprises a single set of N first correlations between the at least one part of the first signal and the at least one part of the N third signals, delivering a single set of N first results of correlations.

Here again the parts of the third signals comprise for example L samples.

According to one mode of implementation, the at least one estimation comprises a calculation of a global filtered signal resulting from the sum of the N partial filtered signals, and the correlation processing comprises M second correlations between respectively the samples of the M original trains and the corresponding samples of the global filtered signal, delivering M second correlation results.

According to one mode of implementation, the correlation processing delivers at least one set of N first correlation results and a set of M second correlation results and the matrix processing comprises a calculation of a final matrix of size (M−1)×M (M−1 rows and M columns) on the basis of at least one first constant circulant matrix and of the first correlation results and a multiplication of the M second correlation results with the coefficients of the final matrix, so as to obtain the suite of M−1 shift coefficients.

In a simplified version in which N is equal to 1 and the correlation processing delivers a single first correlation result obtained on the basis of the train arising from a single converter, the calculation of the final matrix advantageously comprises a calculation of an intermediate matrix on the basis of a single first constant circulant matrix, a calculation of a pseudo-inverse matrix of the intermediate matrix and a weighting of the coefficients of the pseudo-inverse matrix with the first correlation result, for example its inverse, so as to obtain the coefficients of the final matrix.

The first constant circulant matrix is for example a matrix of size M×M whose coefficients are equal
  to 1 when the row index is equal to the column index,
  to −0.5 if the column index is equal to the row index plus or minus 1 modulo M, and
  to 0 otherwise;
The intermediate matrix is the first constant circulant matrix ridded of its first column, and the weighting of the coefficients of the pseudo inverse matrix comprises a division of these coefficients by the first correlation result so as to obtain the coefficients of the final matrix.

In a broadened version in which N is greater than 1 and the correlation processing delivers N first results obtained on the basis of the train arising from a single converter, the calculation of the final matrix advantageously comprises a calculation of an intermediate matrix on the basis of a linear combination of N second constant circulant matrices respectively arising from N first constant circulant matrices, the combination being weighted by the N first correlation results, and a calculation of a pseudo-inverse matrix of the intermediate matrix, this pseudo-inverse matrix forming the final matrix.

Each first constant circulant matrix of rank i, with i varying from 1 to N, is then for example a matrix of size M×M
  whose coefficients are all zero when i is equal to 0 modulo M, and
  whose coefficients, when i is different from 0 modulo M, are equal to 1 if the row index is equal to the column index, to −0.5 if the column index is equal to the row index plus or minus 1 modulo M, and to 0 otherwise;

each second circulant matrix is then the first circulant matrix ridded of its first column.

The first processing can comprise several successive estimations so as to deliver several successive suites of M−1 shift coefficients, and if appropriate several digital processings of successive corrections successively using the estimated successive suites of M−1 shift coefficients. This makes it possible in particular to take account of a temperature modification.

So as to also compensate a mismatch in terms of gain of the converters, the method can advantageously comprise, before or after the first processing, a second processing comprising, after a transient phase, an equalization of the mean powers of the various initial trains of initial samples performed on the fly and at the tempo of delivery of the samples, on the basis of the values of initial samples of these initial trains, so as to deliver processed trains of processed samples; an initial train can be a train delivered by the corresponding converter or else a train arising from this converter having undergone a preprocessing, for example an offset compensation, or else a train processed by the first processing (compensation of clock shifts).

In practice it is preferable to perform the compensation in terms of gain before the compensation in terms of clock shifts, in particular in the presence of a mismatch in gain.

The transient phase corresponds for example to the number of current samples required to obtain an accuracy deemed acceptable, for the envisaged application, in the values of the mean powers.

This transient period can be longer or shorter as a function of the way in which the mean power is determined.

Thus, for example the determination of each mean power can comprise the use of a modified moving average.

The use of a modified moving average of period L samples, which is computed for example on the basis of a group of values of samples containing the current sample and a plurality of preceding samples of the corresponding train, is particularly advantageous since it allows frequent updating of the estimated value of the mean power and it allows in particular temporal tracking of the changes due to temperature for example.

A modified moving average, although having a period of L samples, is in practice always computed over a very large number of samples and the estimated value then has an acceptable accuracy after a duration corresponding to several periods of L samples.

That said a conventional average calculated every L samples on a group of L samples, and providing a fixed estimated value every L samples, can also be envisaged. Any other average, such as for example a weighted average, can also be envisaged.

Of course during the transient phase the steps implemented for the equalization of the mean powers can be identical to those implemented after this transient phase, but with an inaccuracy in the mean power values determined.

Equalization of the mean powers makes it possible to perform a compensation of the mismatch in terms of gain of the converters. Moreover this equalization is performed on the fly and at the tempo of delivery of the initial samples. Stated otherwise it is performed in a forward ("direct") manner, that is to say without feedback correction of the initial samples on the basis of information situated downstream of the point of reception of the initial samples to be processed (corrected).

Therefore the hardware embodiment thereof is simplified and the compensation of the mismatch faster.

Thus according to one mode of implementation, the equalization of the mean powers of the various initial trains of samples comprises a selection of one of the initial trains as reference initial train and, for each of the other initial trains, an estimation of the relative gain between the corresponding converter and the converter delivering the reference initial train, and a correction of the values of the initial samples of each of the other initial trains by the corresponding relative gain so as to deliver the corresponding processed samples, the estimation and the correction being performed on the fly and at the tempo of delivery of the initial samples.

The notion of "mean power" is advantageously considered in a very broad sense encompassing not only the effective mean power but also any variable representative of this mean power, such as for example an average of absolute values.

Thus according to one mode of implementation, the estimation of the relative gain between each other converter and the converter delivering the reference initial train comprises a determination of an average, for example a modified moving average, of the absolute values of samples of the reference initial train, and, for the other initial train, a determination of an average, for example a modified moving average, of the absolute values of samples of this other initial train, and a ratio of these two averages. The ratio is representative of the relative gain.

The correction of the values of the initial samples of each of the other initial trains by the corresponding relative gain comprises for example a division of the values of the initial samples by the estimated relative gain.

The use of a modified moving average of period L samples, computed for example on the basis of a group of values of initial samples containing the current initial sample and a plurality of preceding initial samples of the corresponding initial train, is particularly advantageous since, as indicated hereinabove, it allows frequent updating of the estimated value of the power and therefore of the relative gain and it allows in particular temporal tracking of the changes due to temperature for example.

So as to also compensate a mismatch in terms of offset of the converters, the method can comprise furthermore, before or after the first processing, and if appropriate before or after the second processing, a third processing comprising, after a transient period (which can be identical or different from that relating to the equalization of the mean powers), for each current primary sample of each primary train arising from the corresponding converter, a calculation of a digital correction word belonging to a pseudo-random sequence of digital words, the average of whose values is equal or almost equal to a value of the shift of the corresponding converter, estimated on the basis of the values of primary samples of the primary train arising from the corresponding converter, and a subtraction of the digital correction word from a current intermediate sample obtained on the basis of this current primary sample so as to deliver a corrected current sample.

A primary train of primary samples can be a train of samples actually delivered by the corresponding converter, if this "offset" compensation is performed before the compensation in terms of gain, or else a processed train of processed samples if this offset compensation is performed after the gain compensation processing or after the clock shifts compensation processing.

Here again this transient phase corresponds for example to the number of current samples required to obtain an accuracy deemed acceptable, for the envisaged application, in the estimated value of the shift which will correspond to the average of the values of the pseudo-random sequence of digital words.

This transient period can be longer or shorter as a function of the way in which this mean value is estimated.

Thus, for example the estimation of the value of the voltage offset of the corresponding converter can comprise a modified moving average of the values of primary samples arising from this converter.

The use of a modified moving average of period L samples, computed for example on the basis of a group of values of samples containing the current sample and a plurality of preceding samples of this train, is particularly advantageous since it allows frequent updating of the estimated value and it allows in particular temporal tracking of the changes due to temperature for example.

That said a conventional average calculated every L samples on a group of L samples, and providing a fixed estimated value every L samples, can also be envisaged. Any other average, such as for example a weighted average, can also be envisaged.

Of course during the transient phase the hereinabove mentioned steps of calculating the digital correction word and of subtraction can be identical to those performed after this transient phase, but the value of the correction word will not be equal or almost equal to the shift value of the corresponding converter.

The corrected current sample and the current primary sample arising from the converter can be coded on one and the same number of bits. In this case the current intermediate sample can be identical to the current primary sample.

However, in order to decrease the noise due to the offset residuals, the corrected current sample can advantageously be coded on a larger number of bits than that of the current primary sample arising from the corresponding converter. In this case, the current intermediate sample can be the current primary sample supplemented with an appropriate number of low-order bits equal to 0.

On account of this subtraction with the correction words arising from the pseudo-random sequence, the mean value of the primary samples arising from the corresponding converter is "continually" equalized to a constant reference value, in practice a zero or almost zero value. The estimated shift of the corresponding converter is therefore taken into account to perform a corresponding correction at the level of each sample.

Since the pseudo-random sequence has as average the estimated value of the shift, certain correction words have a greater value than this estimated shift value, others have a lower value, others an equal value. Consequently, at the level of each sample taken individually, the correction can be better or worse giving rise to local noise. That said globally these disturbances, due to quantization errors during correction, are not manifested by spurious frequency spectral lines localized at frequencies that are multiples of Fs/M but are spread over the whole of the frequency spectrum.

A particularly simple way of achieving the pseudo-random sequence having as average the estimated value of the shift consists in calculating an initial pseudo-random sequence of zero or almost zero average and to sum over each word delivered by this initial sequence the estimated value of the shift.

According to one mode of implementation, the corrected samples of each train are coded on n bits and the calculation of the digital correction word comprises an estimation on the basis of the values of the primary samples, of the value of the shift of the corresponding converter, coded on b bits and associated with the current primary sample, b being greater than n, a determination of the digital correction word coded on n bits on the basis of the estimated shift value coded on b bits and of b-n bits, for example the b-n low-order bits, of an initial digital word arising from an initial pseudo-random sequence of initial digital words whose values have a zero or almost zero average.

Thus the value of "the offset" of the corresponding converter is determined on a greater number of bits than that of the primary samples arising from the converter, thereby making it possible to estimate the decimal part of "the offset". This decimal part is corrected by b-n bits, for example the b-n low-order bits, of the initial digital word arising from the initial pseudo-random sequence, and the digital correction word is therefore the integer part of the estimated value of the offset, which is either unchanged, or incremented by 1 or decremented by 1 as a function of the values of the b-n bits of the initial digital word that are used for the correction.

This makes it possible to perform an offset estimation and a correction equal on average to the estimated value while limiting the number of bits of each corrected sample to n bits, for example 10 bits, instead of seeking to increase this number so as to correct the decimal part of "the offset".

More precisely, according to one mode of implementation, the determination of the digital correction word comprises the delivery of the initial digital word, a calculation of a modified digital word comprising the b-n bits of the initial digital word, supplemented with n high-order bits all having the same logic value (for example the logic value 0 or the logic value 1), and a summation of the modified digital word and of the estimated shift value, the digital correction word being formed by the n high-order bits of the word of b bits resulting from the summation.

According to another aspect, there is proposed a processing device. An input device receives a sampled signal comprising M original trains of liminary samples respectively arising from M analog/digital converters with temporal interleaving. In this case, M is greater than two and one of the original trains is considered to be the reference train. A first processing module comprises an estimation unit configured to perform for the M−1 other original trains, at least one estimation of a suite of M−1 shift coefficients respectively representative of clock shifts between these M−1 other original trains and the reference train. The estimation unit comprises, on the one hand, a correlation unit configured to perform a correlation processing involving at least one part of the sampled signal. At least one part of at least one first signal is gleaned from a derived signal representative of a temporal derivative of the sampled signal and at least one part of N partial filtered signals respectively representative of N weighted differences between N pairs of bracketing versions flank the sampled signal. N is greater than or equal to 1. The estimation unit comprises, on the other hand, a matrix processing unit configured to perform a matrix processing on the results of this correlation processing.

According to one embodiment the first processing module comprises a correction unit configured to perform at least one processing for correcting the M−1 other trains involving respectively M−1 second signals gleaned from the derived signal and the suite of M−1 shift coefficients, so as to deliver M processed trains including the reference original train and M−1 corrected original trains.

The correction unit can be configured to perform a first-order Taylor approximation.

According to one embodiment the parts of the sampled signal, of the at least one first signal and of the filtered partial signal or signals on which the at least one correlation processing is performed each comprise a group of L samples of the corresponding signal.

The first signal can moreover comprise the samples of the derived signal that are associated with one of the M trains and the M−1 second signals can comprise respectively the samples of the derived signal that are respectively associated with the M−1 other trains.

According to one embodiment the correlation unit is configured to perform at least one set of N first correlations between the at least one part of the at least one first signal and at least one part of N third signals respectively gleaned from the N partial filtered signals, delivering at least one set of N first results of correlations.

According to a simplified version the N third signals comprise the samples of the N partial filtered signals associated with the one of the M trains, and the correlation unit is configured to perform a single set of N first correlations between the at least one part of the first signal and the at least one part of the N third signals, delivering a single set of N first results of correlations.

The parts of the third signals can also comprise L samples.

According to one embodiment the estimation unit is furthermore configured to calculate a global filtered signal resulting from the sum of the N partial filtered signals, and the correlation unit is configured to perform M second correlations between respectively the samples of the M original trains and the corresponding samples of the global filtered signal, delivering M second correlation results.

The correlation unit can be configured to perform each correlation by using an average of L products of samples.

According to one embodiment the correlation unit is configured to deliver at least one set of N first correlation results and a set of M second correlation results and the matrix processing unit is configured to calculate a final matrix of size (M−1)×M on the basis of at least one first constant circulant matrix and of the first correlation results and to perform a multiplication of the M second correlation results with the coefficients of the final matrix, so as to obtain the suite of M−1 shift coefficients.

In a simplified version, N is equal to 1 and the correlation unit is configured to deliver a single first correlation result obtained on the basis of the train arising from a single converter, and the matrix processing unit is configured to calculate an intermediate matrix on the basis of a single first constant circulant matrix, a pseudo-inverse matrix of the intermediate matrix and to perform a weighting of the coefficients of the pseudo-inverse matrix with the first correlation result so as to obtain the coefficients of the final matrix.

The first constant circulant matrix is then for example a matrix of size M×M whose coefficients are equal to 1 when the row index is equal to the column index, to −0.5 if the column index is equal to the row index plus or minus 1 modulo M and to 0 otherwise, the intermediate matrix is the first constant circulant matrix ridded of its first column, and the matrix processing unit is configured to perform a division of these coefficients by the first correlation result so as to obtain the coefficients of the final matrix.

In a more general version, N is greater than 1 and the correlation unit is configured to deliver N first results obtained on the basis of the train arising from a single converter, and the matrix processing unit is configured to calculate an intermediate matrix on the basis of a linear combination of N second constant circulant matrices respectively arising from N first constant circulant matrices, the combination being weighted by the N first correlation results, and a pseudo-inverse matrix of the intermediate matrix, this pseudo-inverse matrix forming the final matrix.

Each first constant circulant matrix of rank i, with i varying from 1 to N, is then for example a matrix of size M×M
whose coefficients are all zero when i is equal to 0 modulo M, and
whose coefficients, when i is different from 0 modulo M, are equal
to 1 if the row index is equal to the column index,
to −0.5 if the column index is equal to the row index plus or minus 1 modulo M, and
to 0 otherwise,
each second circulant matrix being the first circulant matrix ridded of its first column.

According to one embodiment the estimation unit is configured to perform several successive estimations so as to deliver several successive suites of M−1 shift coefficients, and the correction unit is configured to perform several successive processings of corrections successively using the estimated successive suites of M−1 shift coefficients.

According to a variant the device furthermore comprises a second processing module configured to perform before or after the first processing, a second processing comprising, after a transient phase, an equalization of the mean powers of the various initial trains of initial samples performed on the fly and at the tempo of delivery of the samples, on the basis of the values of initial samples of these initial trains, so as to deliver processed trains of processed samples, an initial train being able to be a train arising from the corresponding converter or else a processed train delivered by the first processing module.

According to one embodiment one of the initial trains is taken as reference initial train. The second processing module comprises a first block configured to perform on the fly and at the tempo of delivery of the initial samples, for each of the other initial trains, an estimation of the relative gain between the corresponding converter and the converter associated with the reference initial train. The second processing module also comprises a second block configured to perform on the fly and at the tempo of delivery of the initial samples, a correction of the values of the initial samples of each of the other initial trains by the corresponding relative gain.

According to one embodiment the first block comprises a number of circuits. A first circuit is configured to determine an average, for example a modified moving average, of the absolute values of initial samples of the reference initial train. Second circuits are respectively configured to determine for the other initial trains, the averages, for example modified moving averages, of the absolute values of initial samples of these other initial trains. Third circuits are respectively configured to determine ratios between the average of the absolute values of initial samples of the reference initial train and the averages of the absolute values of initial samples of the other initial trains, the ratios being representative of the relative gains.

The second block comprises for example dividers respectively configured to divide values of the initial samples of the other initial trains by the corresponding estimated relative gains.

According to another variant the device furthermore comprises a third processing module configured to perform, before or after the first processing, and if appropriate before or after the second processing, a third processing. The third processing is performed, after a transient phase, for each current primary sample of each primary train arising from the corresponding converter. The processing includes a calculation of a digital correction word belonging to a pseudo-random sequence of digital words, the average of whose values is equal or almost equal to a value of the shift of the corresponding converter, estimated on the basis of the values of primary samples of the primary train arising from the corresponding converter. The processing also includes a subtraction of the digital correction word from a current intermediate sample obtained on the basis of this current primary sample so as to deliver a corrected current sample.

A primary train can be a train delivered by the corresponding converter or a processed train delivered by the first or the second processing module.

According to one embodiment in which the corrected samples are coded on n bits, the third processing module comprises, for each primary train of primary samples, a first block configured to estimate the value of the shift of the corresponding converter, coded on b bits and associated with the current primary sample, b being greater than n. A second block is configured to determine the digital correction word coded on n bits on the basis of the estimated shift value coded on b bits that is delivered by the first block and of b-n bits of an initial digital word arising from a generator of an initial pseudo-random sequence of initial digital words whose values have a zero or almost zero average.

The second block comprises, for example, a number of components including the generator of the initial pseudo-random sequence. A modification unit is configured to deliver a modified digital word comprising the b-n bits of the initial digital word, supplemented with n high-order bits all having the same logic value. A summation unit is configured to sum the modified digital word and the estimated shift value, the digital correction word being formed by the n high-order bits of the word of b bits that is delivered by the summation unit.

According to one embodiment, the third processing module is configured to estimate the value of the voltage offset of the corresponding converter by a modified moving average of the values of the primary samples arising from this converter.

According to another aspect there is proposed an integrated circuit incorporating a processing device such as defined hereinabove.

BRIEF DESCRIPTION OF THE DRAWINGS

Other advantages and characteristics of the invention will become apparent on examining the detailed description of wholly non-limiting modes of implementation and embodiment, and the appended drawings in which:

FIGS. 1 to 25 deal with various modes of implementation and embodiment of a method and of a processing device according to the invention.

DETAILED DESCRIPTION OF ILLUSTRATIVE EMBODIMENTS

Figure 1:
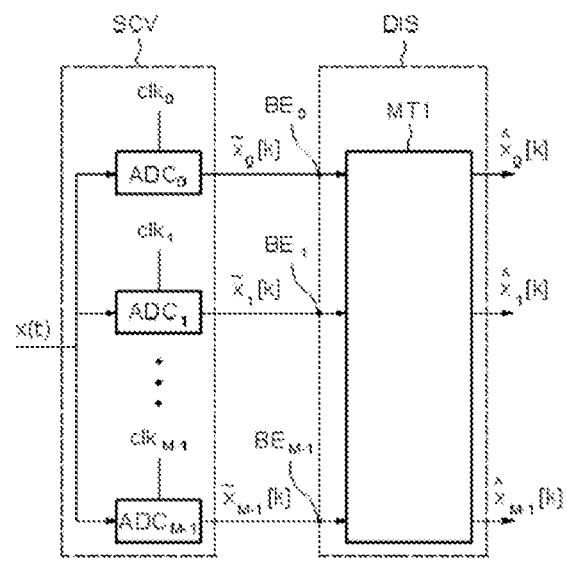

In FIG. 1, the reference SCV designates a system or structure for analog-digital conversion of an analog signal x(t). In the example described here, the analog-digital conversion system employs temporal interleaving comprising several temporally interleaved analog-digital converters (here M analog-digital converters) $ADC_0$-$ADC_{M-1}$.

The analog-digital converter $ADC_m$ is driven by the clock signal $clk_m$.

Figure 2:
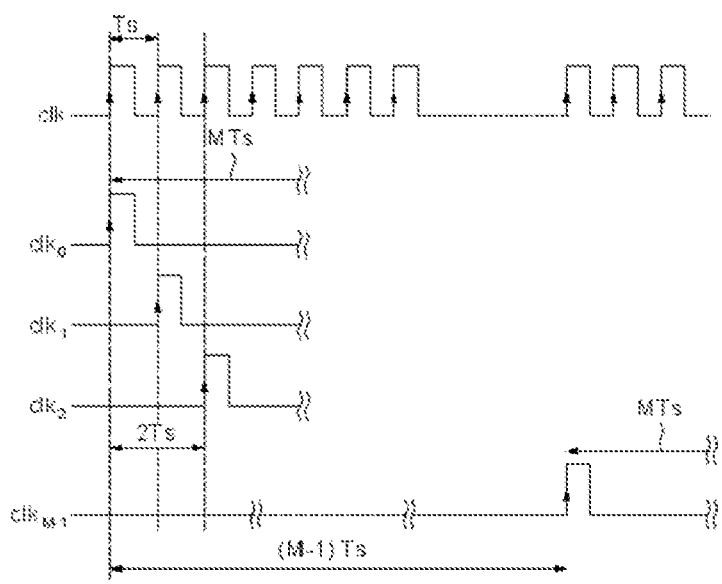

As illustrated more particularly in FIG. 2, the frequency of the clock signal $clk_m$ is equal to Fs/M where Fs denotes the effective frequency at which the analog signal x(t) is sampled. Fs can typically be equal to several GHz or several tens of GHz. The period of each clock signal $clk_m$ is equal to MTs where Ts denotes the period of the clock signal clk having Fs as frequency. Moreover, the sampling of the analog signal x(t) is performed in parallel and in this FIG. 2 which illustrates a perfect theoretical case, each converter $ADC_m$ samples the same analog signal with a temporal shift equal to Ts with respect to the preceding converter.

In this embodiment each converter $ADC_m$ delivers an original train of original samples $\tilde{x}_m[k]$.

Figure 3:
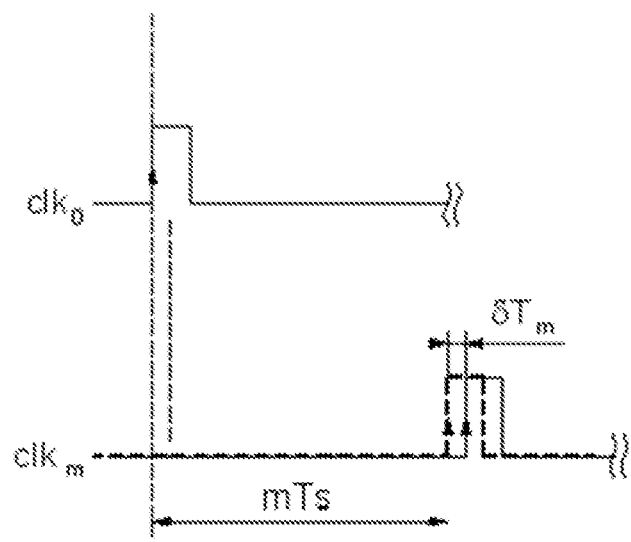

That said, as illustrated in FIG. 3, there may be a clock shift ("timing skew") between the various clock signals $clk_m$.

More precisely, if one of the clock signals is considered to be the reference signal, for example the signal $clk_0$, each clock signal $clk_m$ is shifted temporally by a temporal shift $\Delta t_m$ with respect to this reference clock signal.

Generally, the temporal shifts $\delta t_m$ are small compared with the period Ts.

It is therefore assumed that the ratio $$|r_m| = |\delta t_m / Ts|$$

is much less than 1, typically less than 1%. $r_m$ here denotes a shift coefficient representative of the clock shift between the original train arising from the converter $ADC_m$ and the reference train, in this instance the train arising from the converter $ADC_0$.

The M analog/digital converters of the conversion system SCV do not generally have the same clock shift. This mismatch in terms of clock shift adds to the frequency spectrum of the output signal attenuated spurious images of the frequency spectrum of the input signal around the frequencies that are multiples of Fs/M.

There is therefore proposed a method for processing the signal to be sampled, aimed at compensating this mismatch in terms of clock shift.

This processing method is implemented within a processing device DIS whose M input terminals $BE_0$-$BE_{M-1}$ receive the M trains of samples $\tilde{x}_m[k]$, with m varying from 0 to M−1.

In this regard, the device DIS comprises a first processing module MT1 delivering as output processed trains of processed samples $\hat{x}_m[k]$, with m varying from 0 to M−1.

In a general manner, the first processing module MT1 comprises estimation unit configured to perform, for the M−1 original trains other than the reference original train, at least one estimation of a suite of M−1 shift coefficients $\hat{r}_m$ (m varying from 1 to M−1) respectively representative of the clock shifts between these M−1 other original trains and the reference train. The coefficient $\hat{r}_0$ is taken equal to 0 since it entails the reference.

The module MT1 moreover comprises correction unit configured to perform at least one processing for correcting the M−1 other trains by using in particular these M−1 shift coefficients.

Reference is now made more particularly to FIGS. 4 to 9 to illustrate a first simplified version for embodying the module MT1 of the device DIS.

Figure 4:
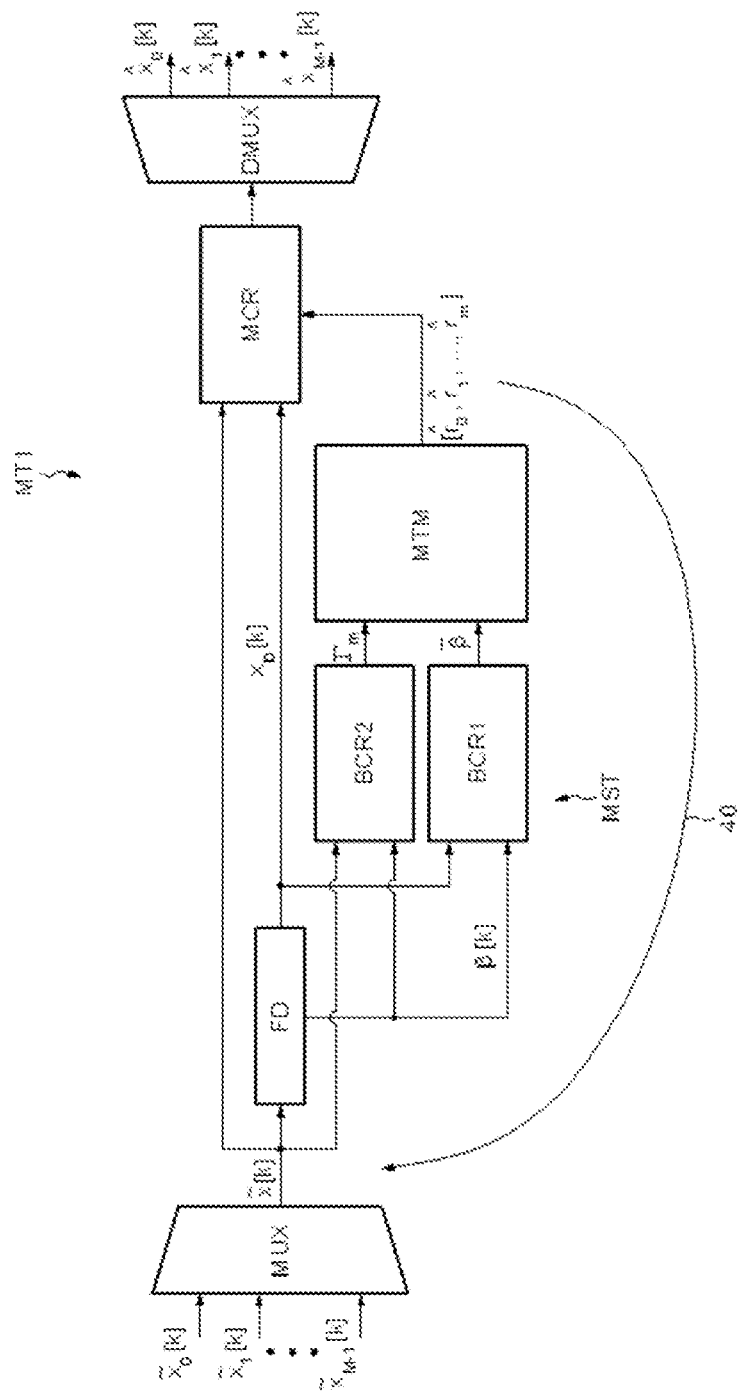

In FIG. 4, it is seen that the M−1 original trains of samples $\tilde{x}_m[k]$ arrive in parallel and are "serialized" by a multiplexer MUX (M samples of the sampled signal arising respectively from the M converters follow one another).

The estimation unit MST is intended to estimate the M−1 shift coefficients $\hat{r}_m$, m varying from 1 to M−1 ($\hat{r}_0$ being taken here equal to 0) comprise a derivative filter FD, correlation unit here comprising two correlation blocks BCR1 and BCR2, and matrix processing unit MTM.

The correction unit MCR receive the samples $\tilde{x}_m[k]$ of the sampled signal, the derived signal $x_D[k]$ delivered by the derivative filter as well as the estimated shift coefficients $\hat{r}_m$, m varying from 0 to M−1.

As long as the coefficients $\hat{r}_m$ have not been estimated, the samples are for example corrected with zero values.

Likewise, the estimation may be performed just once, the suite of coefficients $\hat{r}_m$ then remaining valid throughout the duration of operation of the device However, the estimation can be re-performed repeatedly (arrow 40 FIG. 4) so as to update the suite of shift coefficients $\hat{r}_m$ to take account in particular of alterations in operating temperature for example.

The corrected samples $\hat{x}_m[k]$, with m varying from 0 to M−1, are thereafter "reparallelized" in a demultiplexer DMUX so as to deliver M processed trains of processed samples $\hat{x}_m[k]$, with m varying from 0 to M−1.

This embodiment which involves placing the original samples of the various original trains in series and then placing the processed trains in parallel, is merely a possible exemplary embodiment. Indeed, it would be entirely conceivable to perform the processings which will now be described, in a parallel manner at least for some of them.

Figure 5:
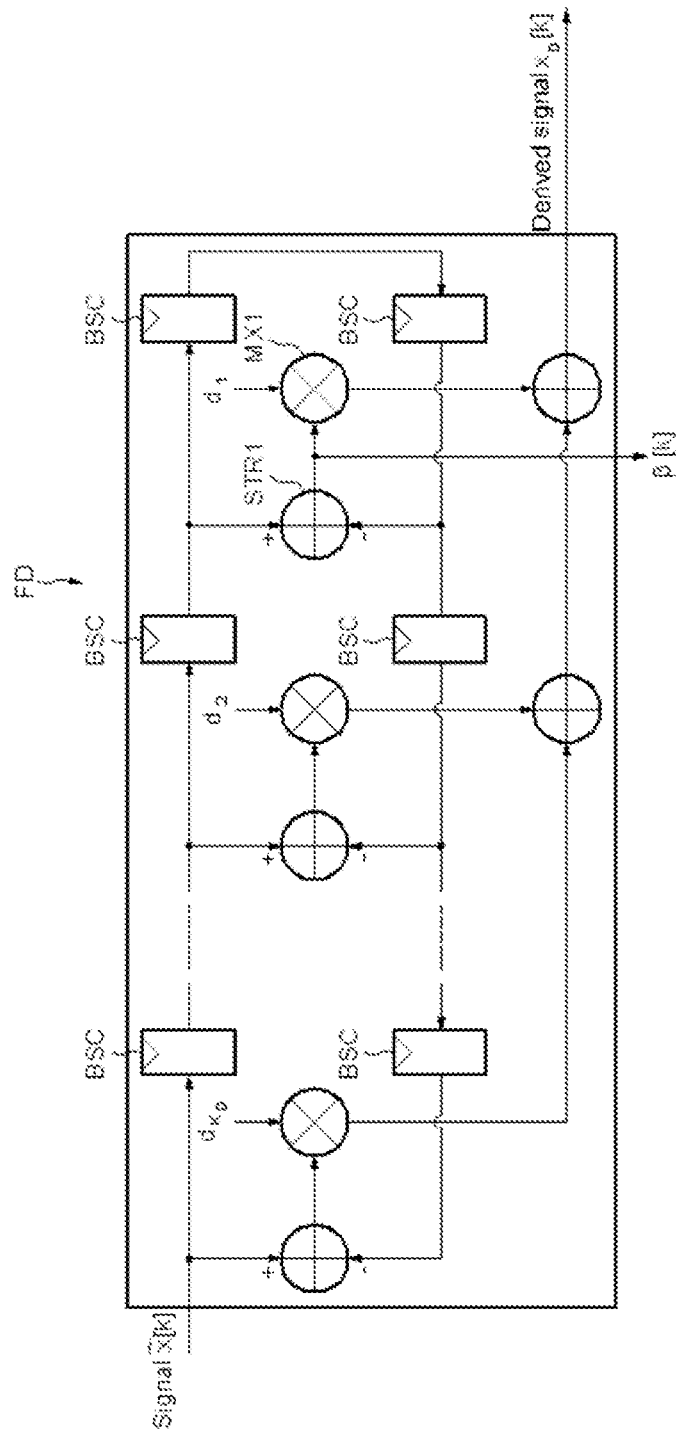

The derivative filter FD is, as illustrated in FIG. 5, a filter of conventional and known structure having $K_D$ coefficients $d_1$-$d_{KD}$, and comprising a set of flip-flops BSC to delay the signal and a set of "subtracter-multiplier" pairs.

The filter FD thus receives the samples $\tilde{x}[k]$ of the sampled signal and delivers as output the corresponding samples $x_D M$ of a derived signal representative of the temporal derivative of the sampled signal.

The response D(z) of the filter FD is defined by formula (I) hereinbelow:

$$D(z)=\sum_{k=1}^{K_D} d_k(z^k-z^{-k}) \quad (I)$$

This filter makes it possible to perform a derivation over the entirety of the Nyquist band or over a limited portion of the spectrum according to the value chosen for the coefficients $d_k$.

In addition to the derived signal $x_d[k]$, the filter FD delivers here, as output from the subtracter STR1 connected to the multiplier MX1, a partial filtered signal $\beta[k]$ representative of a difference between a pair of bracketing versions flanking the sampled signal.

More precisely, in this example, a sample $\beta[k]$ of this partial filtered signal represents the weighted difference between the sample immediately following and the sample immediately preceding a current sample of the sampled signal.

It should be noted here that the partial filtered signal $\beta[k]$ can be considered to arise from the sampled signal $\tilde{x}[k]$ through a finite impulse response filter whose coefficients are (−1, 0, +1). And, in this embodiment, this filter is embodied with a part of the means used to embody the derivative filter FD.

Figure 6:
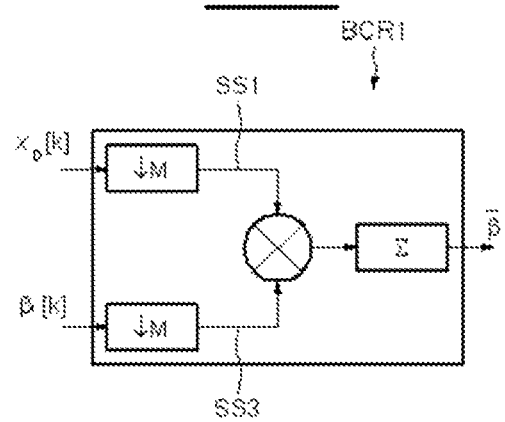

As illustrated in FIG. 6, the block BCR1 of the correlation unit performs a correlation between a first signal SS1 gleaned from the derived signal $x_D[k]$, and a third signal SS3 gleaned from the weighted difference $\beta[k]$.

The block BCR1 then delivers a parameter $\bar{\beta}$ obtained through the correlation performed on L samples according to formula (II) hereinbelow:

$$\bar{\beta} = \frac{1}{L}\sum_{k=0}^{L-1} \beta[kM]\cdot x_D[kM] \quad (II)$$

L can be for example of the order of a million.

The first SS1 comprises the samples $x_D[m]$ of the derived signal associated with one only of the M original trains, since the samples of this first signal SS1 are the samples of the derived signal undersampled by a factor M.

Likewise, the third signal SS3 comprises the samples $\beta[kM]$ associated with the same original train as that associated with the first signal SS1.

This parameter $\bar{\beta}$ thus forms a first correlation result.

Figure 7:
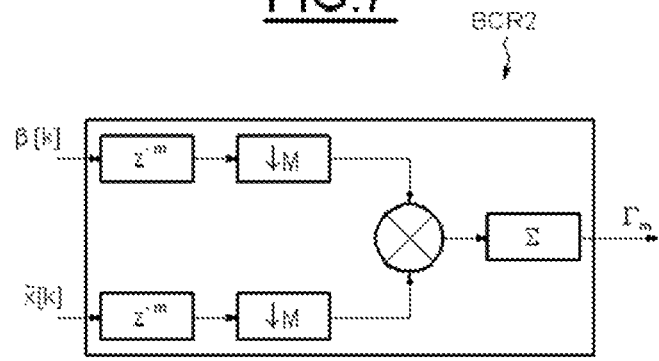

As illustrated in FIG. 7, the block BCR2 performs M correlations between the samples $\tilde{x}[k]$ and the corresponding samples of the filtered partial signal delivered here by the derivative filter FD and corresponding here to the weighted difference $\beta[k]$.

These M correlations, performed here again on L samples, deliver respectively M parameters $\Gamma_m$ with m varying from 0 to M−1, each parameter $\Gamma_m$ being obtained through formula (III) hereinbelow:

$$\Gamma_m = \frac{1}{L}\sum_{k=0}^{L-1} \tilde{x}[kM+m]\beta[kM+m] \quad m \in [0, \ldots, M-1] \quad (III)$$

These parameters $\Gamma_m$ form M second correlation results and are respectively associated with the M converters $ADC_m$.

Figure 8:
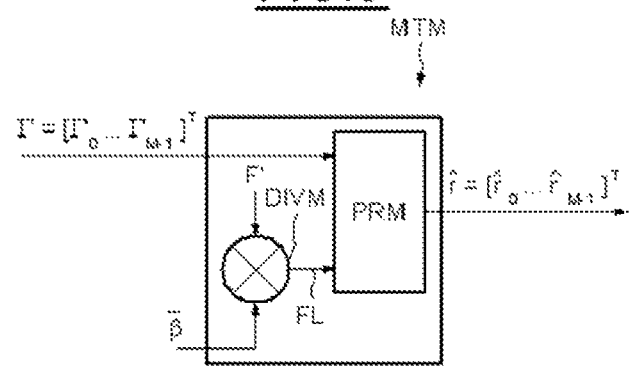

As illustrated in FIG. 8, the matrix processing unit MTM will use the first correlation result $\bar{\beta}$ and the M second correlation results $\Gamma_0$-$\Gamma_{M-1}$ to determine the estimated shift coefficients $\hat{r}_0$-$\hat{r}_{M-1}$, it being understood of course that $\hat{r}_0$ is taken equal to 0.

In this regard, a final matrix FL having M−1 rows and M columns is calculated on the basis of a first constant circulant matrix H' of size M×M and of the first correlation result $\bar{\beta}$.

More precisely, in this simplified variant, the constant circulant matrix H', of size M×M, possesses coefficients satisfying the following conditions:
- when the row index is equal to the column index of the matrix, the coefficients are equal to 1;
- when the column index is equal to the row index plus or minus 1 modulo M, the corresponding coefficient is equal to −0.5;
- the coefficient is equal to 0 for all the other values of the row and column indices.

An intermediate matrix H, having M rows and M−1 columns is then calculated by deleting the first column of the matrix H'.

The matrix F', which is the pseudo inverse matrix of the intermediate matrix H, is then calculated.

More precisely, the matrix F' is defined by the formula (IV) hereinbelow:

$$F'=(H^T H)^{-1} H^T \quad (IV)$$

in which $H^T$ is the transpose of the matrix H.

As this pseudo inverse matrix F' does not depend on the sampled signal, these coefficients can advantageously be stored in a memory of the device DIS.

The coefficients of the final matrix FL are then obtained by weighting the coefficients of the pseudo inverse matrix F' with the first correlation result $\bar{\beta}$.

In this instance, this weighting is a division performed in a divider DIVM.

The matrix processing unit MTM then comprises an operator PRM configured to perform the matrix product of the final matrix FL times the vector Γ so as to obtain the estimated shift coefficients $\hat{r}_m$.

Figure 9:
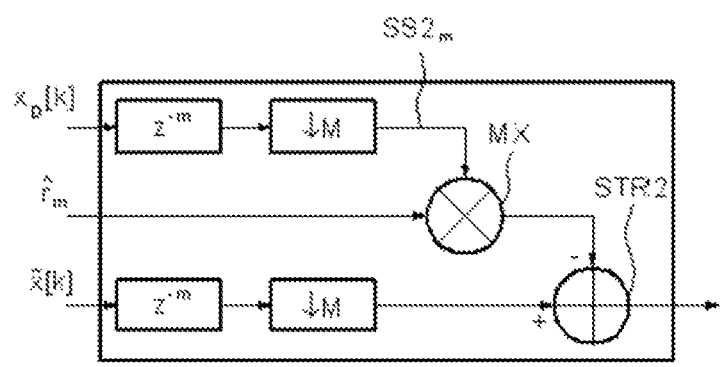

As illustrated in FIG. 9, the correction unit MCR corrects the samples $\tilde{x}[k]$ with the samples $x_D[k]$ of the derived signal and the estimated shift coefficients $\hat{r}_m$.

More precisely, the correction unit MCR uses M−1 second signals $SS2_m$ (with m varying from 1 to M−1). These second signals $SS2_m$ are gleaned from the derived signal $x_D[k]$ and comprise respectively the samples of the derived signal that are respectively associated with the M−1 original trains, other than the reference train.

And, the corrected samples $\hat{x}_m[k]$ arising from the train delivered by the converter $ADC_m$ are obtained by a first-order Taylor approximation according to formula (V) hereinbelow:

$$\hat{x}_m[k] = \tilde{x}[kM+m] - \hat{r}_m x_D[kM+m] \qquad (V)$$

In this regard, the correction unit MCR simply comprises a multiplier MX and a subtracter STR2.

Figure 10:
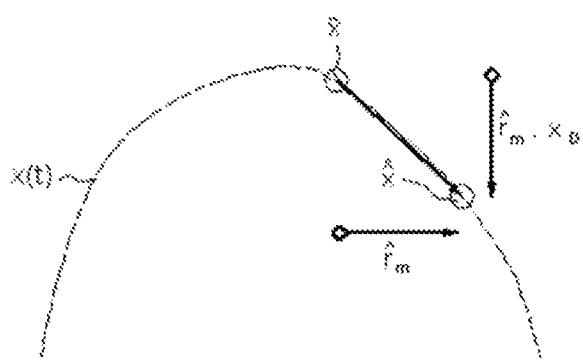
Figure 11:
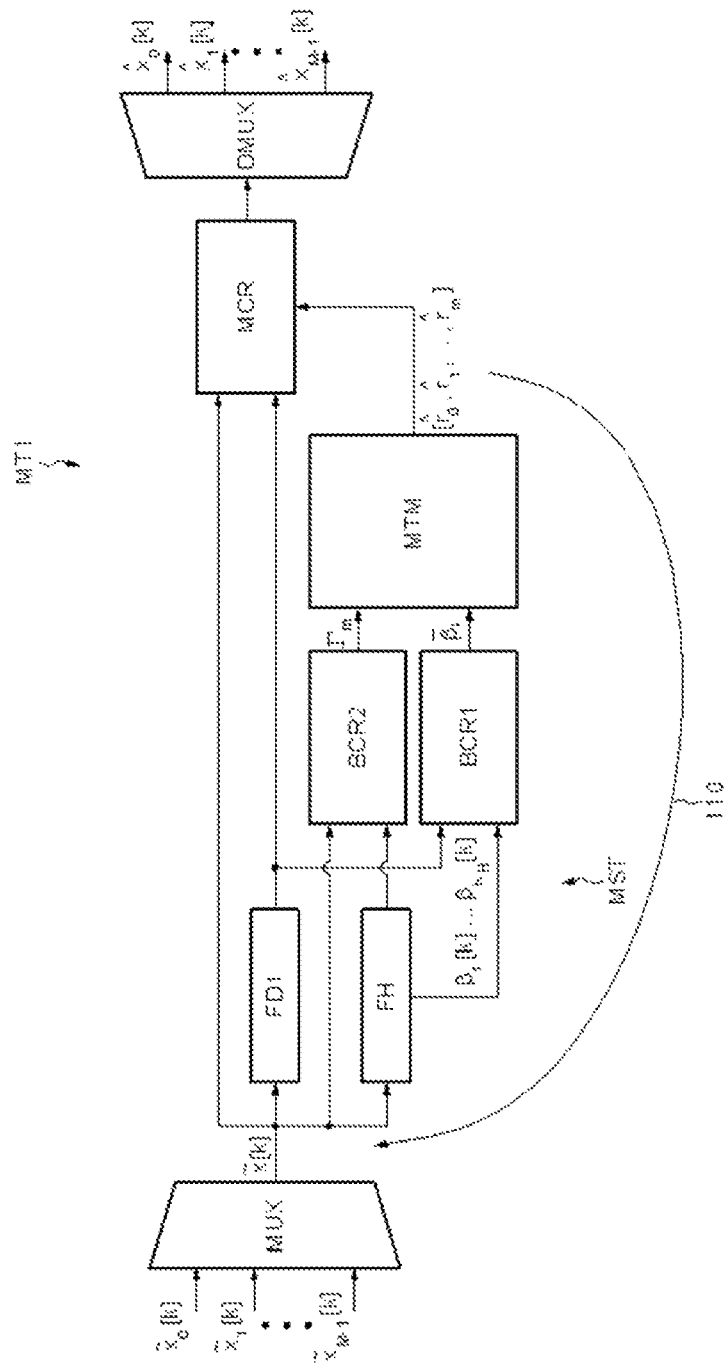

FIG. 10 illustrates schematically and in a graphical manner, the correction of the sample $\tilde{x}$ delivered by the converter $ADC_m$ which will become the corrected sample $\hat{x}$.

Of course, the samples $\tilde{x}_0[k]$ are not corrected since the associated shift coefficient $\hat{r}_0$ is equal to 0. Their value therefore remains unchanged.

Reference is now made more particularly to FIGS. 11 to 16 to describe another embodiment of the first processing module MT1 which corresponds to a version which is generalized with respect to that which was described previously.

More precisely, with respect to the embodiment of FIG. 4, the estimation unit MST comprise in particular an additional filter FH, the structure and function of which will be returned to in greater detail hereinafter. Here again, the estimation of the shift coefficients can be performed several times (arrow 110, FIG. 11).

Figure 12:
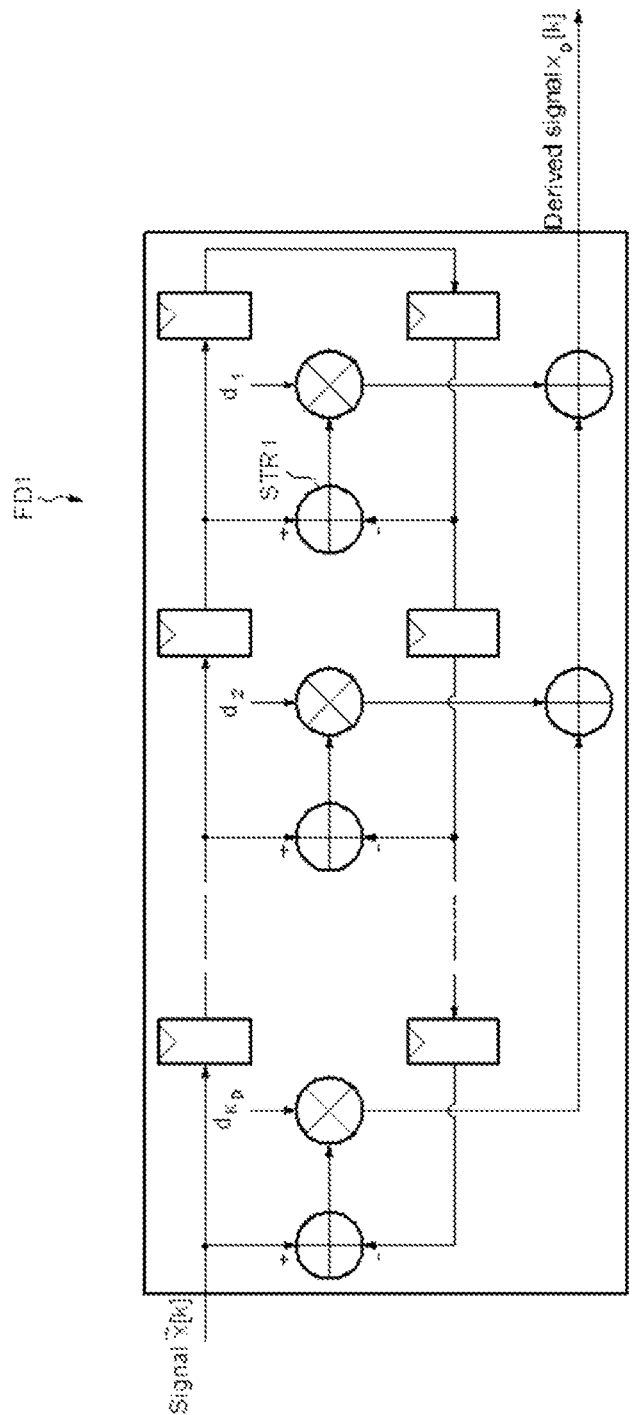

The derivative filter FD1, used in this embodiment and illustrated in FIG. 12, is of analogous structure to that which was described with reference to FIG. 5. But, now, the subtracter STR1 of this derivative filter FD1 does not deliver any weighted difference. The only output from the derivative filter FD1 is the derived signal $x_D[k]$.

Figure 13:
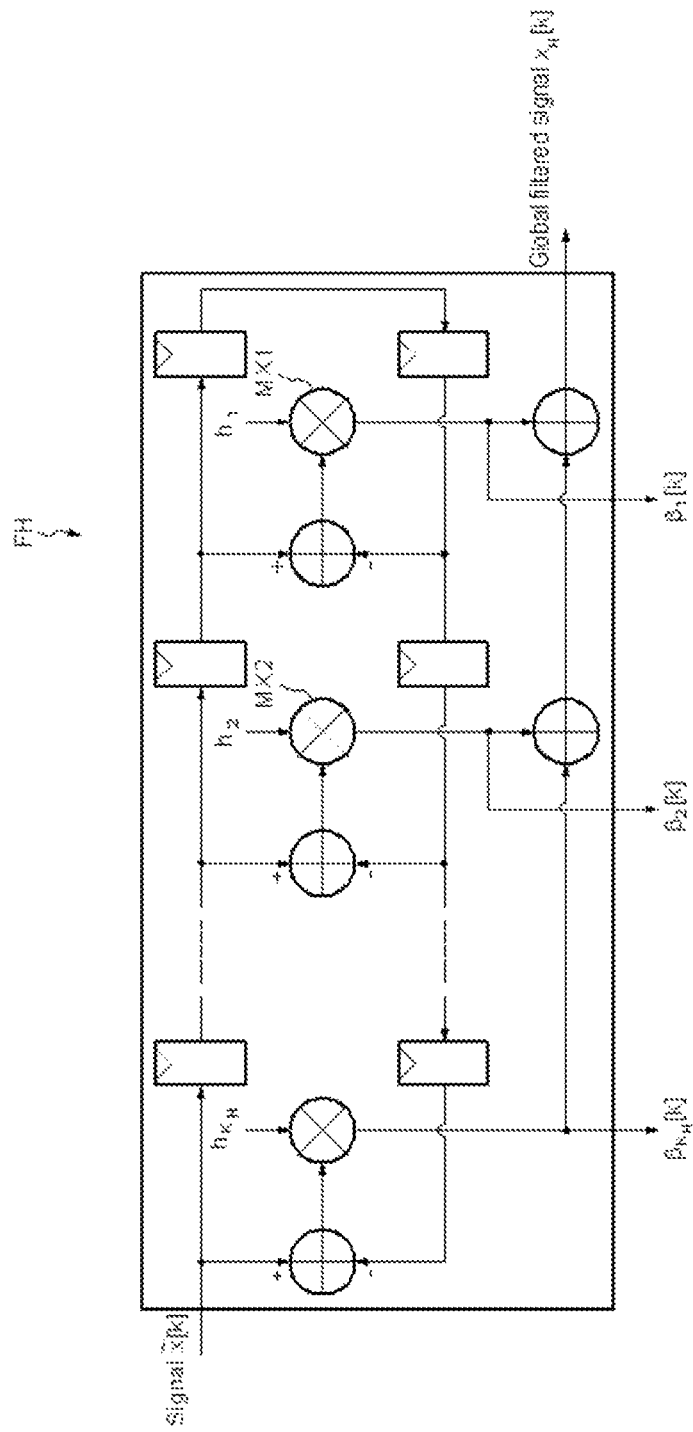

As illustrated in FIG. 13, the filter FH is structurally identical to the filter FD1 but now comprises N coefficients $h_i$ with i varying from 1 to N (N is equal to $K_H$ mentioned in the figures).

Each multiplier $MX_i$ of the filter H delivers a weighted difference $\beta_i[k]$ of a pair of bracketing versions flanking the sampled signal.

More precisely, for a current sample of the sampled signal, $\beta_1[k]$ represents the weighted difference between the sample following (rank n+1) and the sample preceding (rank n−1) this current sample (rank n).

$\beta_2[k]$ represents the weighted difference between the sample of rank n+2 and the sample of rank n−2, and so on and so forth up to $\beta_{k_H}[k]$.

The filter FH thus makes it possible to weight the various frequency zones of the analog signal differently as a function of the values of the coefficients $h_i$.

The global filtered signal $x_H[k]$, delivered as output from the filter FH, is consequently the sum of all the N weighted differences $\beta_i[k]$, with i varying from 1 to N.

Figure 14:
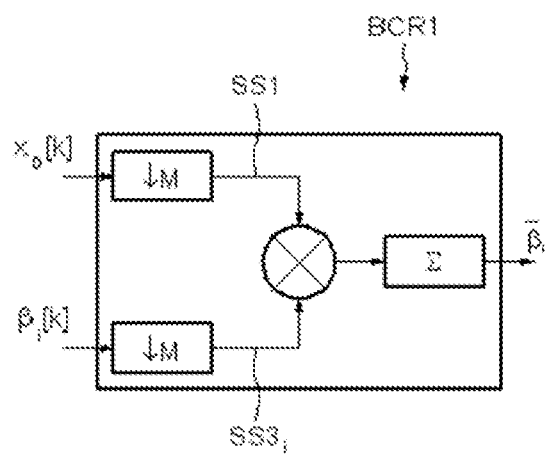
Figure 15:
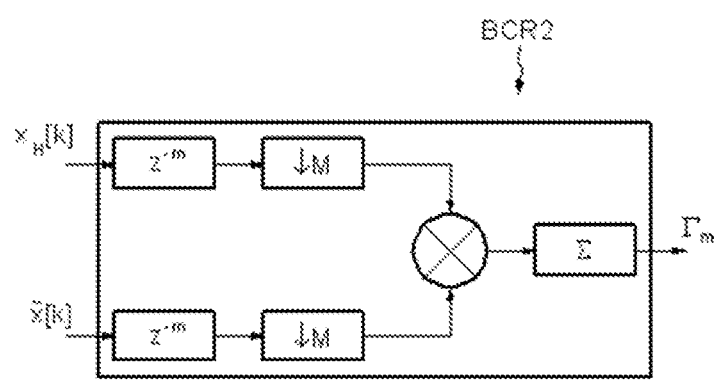

As illustrated in FIG. 14, the block BCR1 of the correlation unit now performs N first correlations between on the one hand L samples of the first signal SS1 gleaned from the derived signal $x_D[k]$ in an analogous manner to what was described with reference to FIG. 6, and on the other hand L samples of each signal $SS3_i$ gleaned from the corresponding weighted difference $\beta_i[k]$, in an analogous manner to what was described hereinabove in FIG. 6 for the signal SS3.

Each first correlation result $\bar{\beta}_i$ can therefore be obtained through formula (VIII) hereinbelow:

$$\bar{\beta}_i = \frac{1}{L}\sum_{k=0}^{L-1} \beta_i[kM] \cdot x_D[kM] \quad i \in [1, \ldots, K_H] \qquad (VIII)$$

The block BCR2 now performs M second correlations between respectively the samples of the M original trains and the corresponding samples of the global filtered signal $x_H$, thus delivering the M second correlation results $\Gamma_m$. These second correlation results $\Gamma_m$ can thus be obtained through formula (IX) hereinbelow:

$$\Gamma_m = \frac{1}{L}\sum_{k=0}^{L-1} \tilde{x}[kM+m] \cdot x_H[kM+m] \quad m \in [0, \ldots, M-1] \qquad (IX)$$

Figure 16:
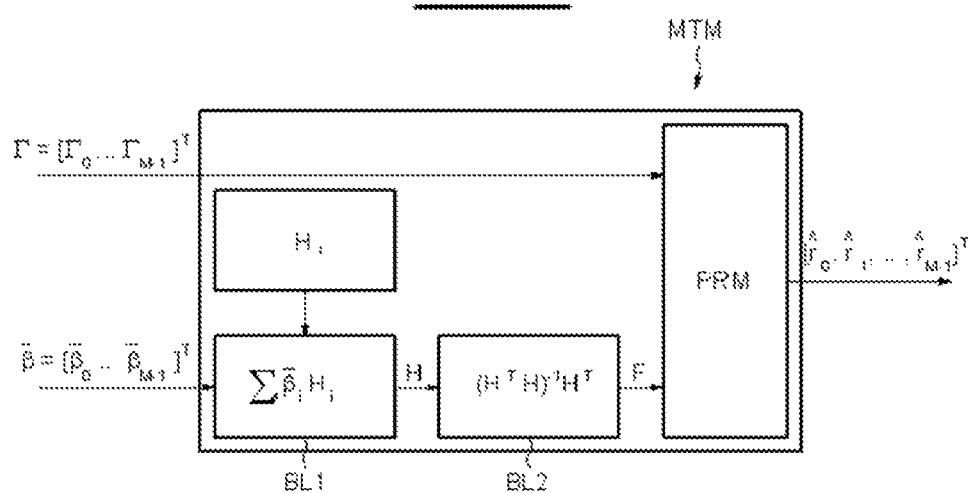

The matrix processing performed by the matrix processing unit MTM illustrated in FIG. 16 is now more complex than that which was described with reference to FIG. 8.

Thus, two blocks BL1, BL2 make it possible to calculate the final matrix F.

More precisely, N first circulant matrices $H'_i$, with i varying from 1 to N, are stored in a memory of the device.

Each first circulant matrix of rank i, $H'_i$, is a matrix of size M×M whose coefficients are all zero when i is equal to 0 modulo M. On the other hand, when i is different from 0 modulo M, i varying from 1 to N, then the coefficients of this first circulant matrix are equal
to 1 if the row index is equal to the column index,
to −0.5 if the column index is equal to the row index plus or minus 1 modulo M, and
to 0 otherwise.

It should be noted here that N may optionally be greater than M.

A second constant circulant matrix $H_i$ is then defined as being the first circulant matrix $H'_i$ ridded of its first column.

These N second circulant matrices can be stored in a memory of the device.

The block BL1 can then calculate an intermediate matrix H through a linear combination of the N second constant circulant matrices $H_i$, this combination being weighted by the N first correlation results $\bar{\beta}_i$, according to formula (X) hereinbelow:

$$H = \sum_{i=1}^{K_H} \bar{\beta}_i H_i \qquad (X)$$

The block BL2 thereafter calculates the final matrix F, which is the pseudo inverse matrix of the intermediate matrix H, according to formula (XI) hereinbelow:

$$F = (H^T H)^{-1} H^T \qquad (XI)$$

Next, in an analogous manner to what was described with reference to FIG. 8, the operator PRM performs the matrix product of the final matrix F with the vector $\Gamma$ so as to deliver the vector $\hat{r}$ containing the M shift coefficients $\hat{r}_0$-$\hat{r}_{M-1}$, it being understood of course that $\hat{r}_0$ is equal to 0.

The correction of the samples performed by the correction unit MCR is analogous to that which was described with reference to FIGS. 9 and 10.

The processing module MT1 can be embodied by a specific integrated circuit (ASIC) or else optionally in a software manner within a microprocessor or else within a programmable logic array ("FPGA: Field Programmable Gate Array").

An analog converter can also exhibit an offset ("shift"). This offset is generally a voltage offset. In the presence of such a shift, a zero value of the analog input signal is manifested by a non-zero digital word. The offset is thus manifested by a horizontal shift of the transfer characteristic of the converter.

The M analog-digital converters of the conversion system SCV do not generally have the same shift. This mismatch between the various shifts is manifested in the frequency spectrum of the sampled signal, by spurious spectral lines appearing at frequencies that are multiples of Fs/M.

The M analog-digital converters of the conversion system SCV do not also generally have the same gain. This mismatch in gain adds to the frequency spectrum of the output signal attenuated spurious images of the frequency spectrum of the input signal around the frequencies that are multiples of Fs/M.

There is therefore proposed a method for processing the sampled signal aimed furthermore at estimating for each of the converters $ADC_m$ a value of its shift, and at correcting the samples accordingly so as to compensate the mismatch while spreading over the whole of the frequency spectrum the residual spectral lines resulting from the quantization of the corrected signal.

There is also proposed a method for processing the sampled signal aimed furthermore at compensating the mismatch in terms of gain of the converters.

Such a variant embodiment is illustrated more precisely in FIGS. 17 to 21.

Figure 17:
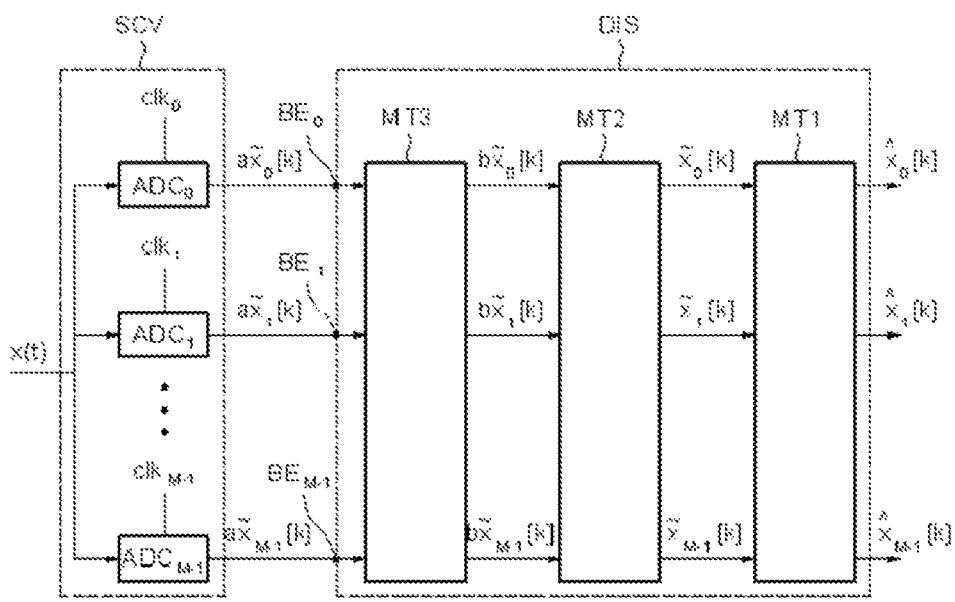

More precisely, as illustrated in FIG. 17, the compensation processing in terms of clock shift ("skew mismatch compensation") is performed in the first processing module MT1.

The compensation processing in terms of gain is performed in a second module MT2 here preceding the first module MT1.

The compensation processing in terms of shift ("offset") is performed in a third processing module here preceding the second processing module.

It should be noted here that although the three modules have been represented connected in series in a functional manner (corresponding here to an offset compensation processing preceding the gain compensation processing, preceding the clock shift compensation processing), some of the hardware units used in these modules can be common to various modules.

It should also be noted that the order of the three compensation processings may be arbitrary, although in practice performing the compensation in terms of gain before the compensation in terms of clock shifts is preferable.

The M converters $ADC_m$ therefore deliver here M primary trains of samples $a\tilde{x}_m[k]$.

The module MT3 consequently delivers M corrected trains of corrected samples $b\tilde{x}_m[k]$ which are then considered for the module MT2 as primary trains of primary samples.

The module MT2 therefore delivers in its turn M processed trains of processed samples $\tilde{x}_m[k]$ which are then considered to be the M original trains of original samples processed by the first processing module MT1 which will deliver as output the M trains of processed samples $\hat{x}_m[k]$.

The processings performed within the third processing module MT3 on each of the M trains of samples are identical. They are for example performed in parallel.

Only the processings performed on the primary train of primary samples $a\tilde{x}_m[k]$ arising from the converter $ADC_m$ will now be described while referring more particularly to FIGS. 18 to 20.

The processing module MT3 is therefore configured to, for each current primary sample of this primary train, calculate a digital correction word $mc_m[k]$ belonging to a pseudo-random sequence of digital words, the average of whose values is equal or almost equal to the estimated value of the shift in terms of voltage $\hat{o}_m[k]$ of the corresponding converter $ADC_m$, this shift value $\hat{o}_m[k]$ being computed on the basis of the values of a group of primary samples, here by performing a modified moving average.

Moreover, the processing module MT3 is configured to subtract, in a subtracter STR, the digital correction word $mc_m[k]$ from the current primary sample $a\tilde{x}_m[k]$ so as to deliver the corrected sample $b\tilde{x}_m[k]$.

The corrected sample $b\tilde{x}_m[k]$ can then be obtained through formula (XII) hereinbelow:

$$b\tilde{x}_m[k]=a\tilde{x}_m[k]-mc_m[k] \qquad (XII)$$

And even if the processings described here are applied right from the first current primary sample, it is only after a transient phase of several periods of L samples that the average of the values of the correction words will have converged to the value of the shift in voltage of the corresponding converter with acceptable accuracy.

The number L can here again for example be chosen to be of the order of a million.

Figure 18:
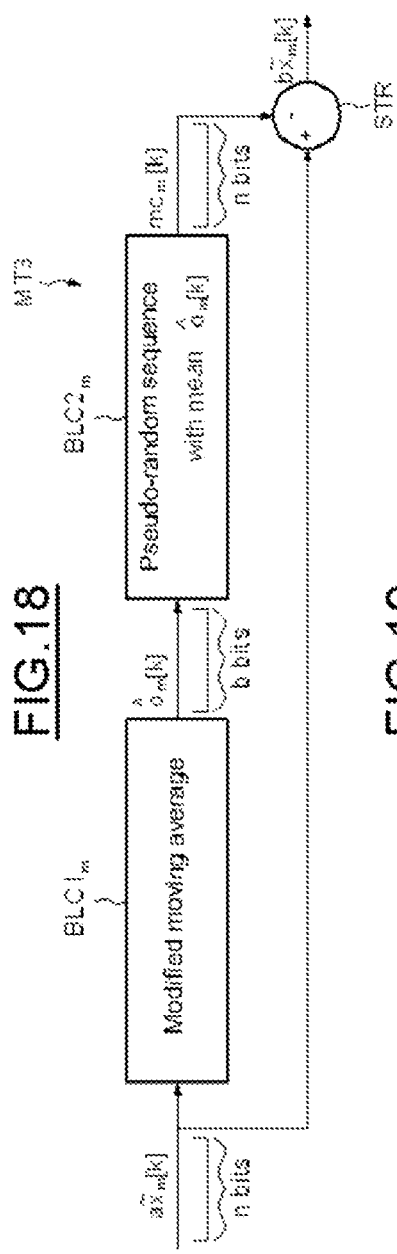

As illustrated in FIG. 18, the primary samples $a\tilde{x}_m[k]$, arising from the converter $ADC_m$, are in this example coded on n bits, for example 10 bits, just like the corrected samples $b\tilde{x}_m[k]$.

The processing module MT3 then comprises, associated with the converter $ADC_m$, a first block $BLC1_m$ configured to, on the basis of the values $a\tilde{x}_m[k]$ of a group of primary samples, estimate here by performing a modified moving average of period L samples, the value of the shift $\hat{o}_m[k]$.

The shift $\hat{o}_m[k]$ can then be obtained through formula (XIII) hereinbelow:

$$\hat{o}_m[k] = \hat{o}_m[k-1] - \frac{\hat{o}_m[k-1]}{L} + \frac{a\tilde{x}_m[k]}{L} \qquad (XIII)$$

$\hat{o}_m[0]$ is taken equal to 0.

The number L can be for example chosen equal to a power of 2 so as to avoid the use of a divider, this division operation then being able to be performed through a simple wiring.

This offset (shift) is determined on a number of bits b that is greater than n. The number b can for example be taken equal to 16.

Figure 19:
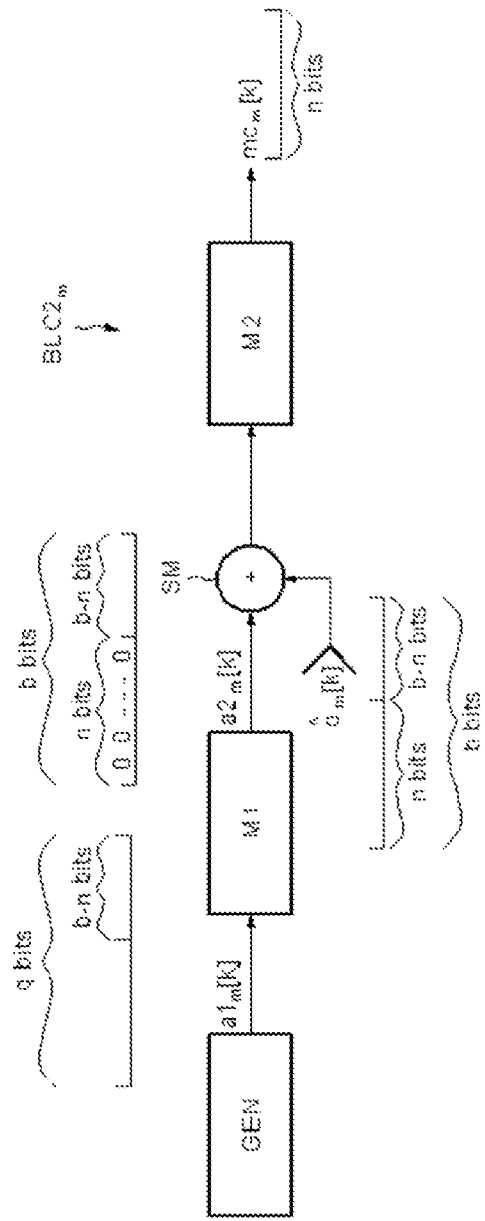

The second block $BLC2_m$ of the processing module MT3, associated also with the converter $ADC_m$, comprises, as illustrated more particularly in FIG. 19, a generator GEN configured to deliver an initial pseudo-random sequence of initial digital words $a1_m[k]$ whose values have a zero or almost zero average.

Figure 20:
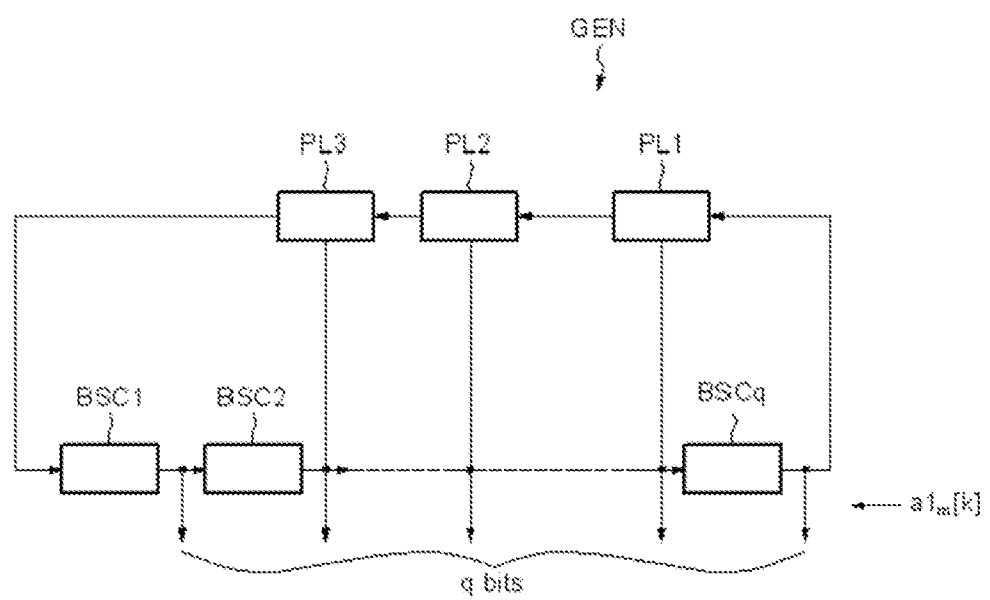

As illustrated in FIG. 20, the generator GEN can be for example of the type based on a linear feedback shift register (LFSR), whose structure and manner of operation are well known to the person skilled in the art.

More precisely, as illustrated in FIG. 20, the shift register here comprises q flip-flops BSC1-BSCq connected in series and looped back by way of several logic gates, here three logic gates PL1, PL2, PL3, for example of the EXCLUSIVE OR type.

At the tempo of the clock signal $clk_m$ for example, controlling the flip-flops, the q outputs of the flip-flops deliver the q bits of an initial digital word $a1_m[k]$ of the pseudo-random sequence.

In theory, the values of the words $a1_m[k]$ have a zero average when q is equal to infinity. In practice, when q has a high value, for example 32, it may be estimated that the values of the words $a1_m[k]$ have a zero or almost zero average.

Of course, this type of random generator is merely a non-limiting particular example. Other types of random generators well known to the person skilled in the art can also be used such as for example a linear congruential generator.

The block $BLC2_m$ also comprises a modification unit M1 configured to deliver a modified digital word $a2_m[k]$ comprising in this example the b-n low-order bits of the initial digital word $a1_m[k]$ supplemented with n high-order bits all having the same logic value, here the logic value 0.

In practice, the modification unit M1 can be embodied simply by wiring, the n locations of a register that are intended to contain the word $a2_m[k]$ and that correspond to the n high-order bits being for example linked permanently to earth.

The modified digital word $a2_m[k]$ consequently has b bits and is summed in summation unit SM, typically a conventional adder, with the shift $ô_m[k]$ also coded on b bits.

The result of the summation is a word on b bits from which unit M2 take away the b-n low-order bits so as to keep only n bits and thus form the digital correction word $mc_m[k]$.

Here again, the unit M2 can very well be embodied simply by wiring.

It is therefore seen that, since the estimated value $ô_m[k]$ of the shift is added to digital words of an initial pseudo-random sequence of zero mean value, the pseudo-random sequence of correction words that is provided by the block $BLC2_m$ has this shift value as average.

The value of the digital correction word $mc_m[k]$ can therefore sometimes be greater than the value of the shift, sometimes lower, sometimes equal. These pseudo-random sequences delivered by the M blocks $BLC2_m$ thus make it possible to spread over the whole of the spectrum of the signal the residual spectral lines caused by the quantization errors in the corrected signal.

The processing module MT3 can be embodied by a specific integrated circuit (ASIC) or else optionally in a software manner within a microprocessor or else within a programmable logic array ("FPGA: Field Programmable Gate Array").

This offset compensation processing can exhibit different variants.

Thus, although advantageous since it makes it possible to continually update the estimated shift values, in particular in the presence of temperature modifications for example, the modified moving average performed by each block $BLC1_m$ can be replaced with a fixed average calculated on a group of L samples or any other type of average.

Moreover, it is not necessary to use all the bits of the primary samples to estimate a shift value. It is possible to use a smaller number of bits, for example two bits, and this will then require a longer convergence time and therefore a longer transient phase.

The b-n bits of the initial digital word are not necessarily the b-n low-order bits but may be b-n arbitrary bits of this initial digital word.

In order to decrease the noise due to the offset residuals, the corrected current sample $b\tilde{x}_m[k]$ can be coded on a larger number of bits than that of the current primary sample $a\tilde{x}_m[k]$ delivered by the corresponding converter $ADC_m$.

Thus if it is assumed that the current primary sample $a\tilde{x}_m[k]$ is coded on n' bits and that the corrected current sample $b\tilde{x}_m[k]$ is coded on n bits, with n greater than n', the first block $BLC1_m$ takes n' bits as input and still outputs b bits with b greater than n.

The subtracter STR still subtracts the correction word of n bits, but now not from the current primary sample $a\tilde{x}_m[k]$ of n' bits, but from a current intermediate sample of n bits which is obtained by supplementing the current primary sample $a\tilde{x}_m[k]$ with n-n' low-order bits equal to 0.

Here again, this obtaining of the current intermediate sample can be performed simply by wiring.

As regards the gain mismatch compensation processing performed by the second processing module MT2, it advantageously comprises an equalization of the mean powers of the various initial trains of initial samples, performed on the fly and at the tempo of delivery of the samples, on the basis of the values of the samples of these initial trains.

The mean powers are determined here by modified moving averages of period L samples.

And even if the processings which will be described here are applied right from the first current sample, it is here again only after a transient phase of several periods of L samples that the values of the mean powers will have converged to exact or almost exact values with acceptable accuracy.

The number L can be for example chosen here again to be of the order of a million.

Figure 21:
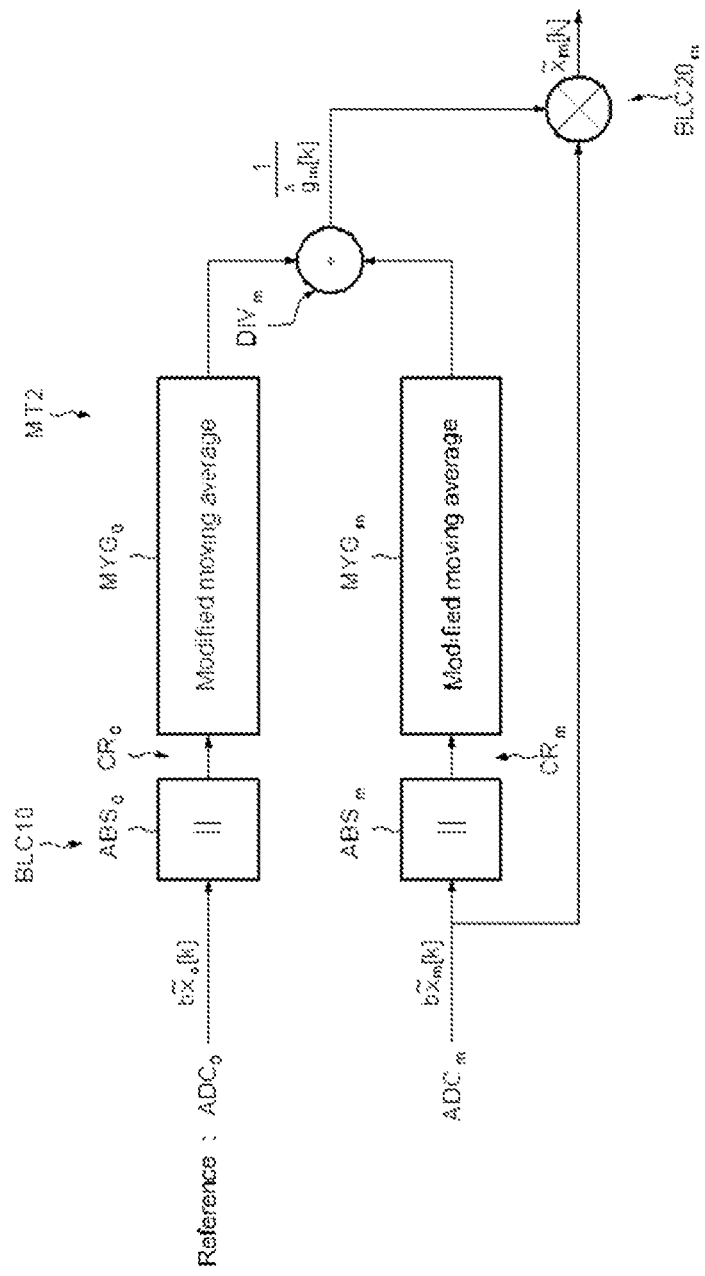

As illustrated in FIG. 21, one of the initial trains is taken as reference train. In the example described here, this is the initial train of initial samples delivered by the converter $ADC_0$.

The processings performed on each of the other M−1 initial trains of initial samples are identical. They are for example performed in parallel.

The second processing module MT2 comprises a first block BLC10 configured to perform on the fly and at the tempo of delivery of the initial samples $b\tilde{x}_m[k]$, for each of the other trains, an estimation of the relative gain between the corresponding converter and the converter $ADC_0$ delivering the reference train. The second processing module MT2 also comprises a second block BLC20 configured to perform on the fly and at the tempo of delivery of the initial samples $b\tilde{x}_m[k]$, a correction of the values of the samples of each of the other trains by the corresponding relative gain.

Only the processings performed on the train of samples $b\tilde{x}_m[k]$ arising from the converter $ADC_m$, m being different from 0, as well as the corresponding hardware units will now be described while referring more particularly to FIG. 21.

The first block BLC10 comprises a first circuit $CR_0$ configured to determine the modified moving average of the absolute values of the initial samples $b\tilde{x}_0[k]$ of the reference train.

The first block BLC10 also comprises a second circuit $CR_m$ configured to determine the modified moving average of the absolute values of the initial samples $b\tilde{x}_m[k]$ of the train arising from the converter $ADC_m$.

The first block BLC10 further comprises a third circuit $DIV_m$ configured to determine the ratio between the average of the absolute values of the samples $b\tilde{x}_0[k]$ of the reference train and the average of the absolute values of the samples $b\tilde{x}_m[k]$ of the train arising from the converter $ADC_m$, the ratio being representative of the estimated gain $\hat{g}_m[k]$ of the converter $ADC_m$ in relation to the converter $ADC_0$.

The first circuit $CR_0$ comprises a first sub-circuit $ABS_0$ configured to deliver the absolute value of the sample $b\tilde{x}_0[k]$ present at input.

By way of example, the sub-circuit $ABS_0$ tests the value of the sign bit of the sample.

If the sign bit is positive, the sub-circuit $ABS_0$ delivers the data bits of the sample as they are, then representing the absolute value of the sample.

If the sign bit is negative, the sub-circuit $ABS_0$ inverts the data bits of the sample and adds 1 to the intermediate sample thus obtained, these new data bits then representing the absolute value of the sample.

The sub-circuit $ABS_0$ can thus be embodied in a very simple manner, in part by wiring and by using a multiplexer, inverters and an adder.

The determination of an absolute value is consequently simpler to carry out than the determination of a power which requires a squaring operation.

The first circuit $CR_0$ also comprises a sub-circuit $MYG_0$ configured to, on the basis of the values $b\tilde{x}_m[k]$ of a group of samples, determine here by performing a modified moving average of period L samples, the value of the following expression (formula XIV):

$$\hat{p}_0[k-1] - \frac{\hat{p}_0[k-1]}{L} + \frac{|b\tilde{x}_0[k]|}{L} \quad \text{(XIV)}$$

$\hat{p}_0[0]$ is taken equal to 0.

The second circuit $CR_m$ comprises a sub-circuit $ABS_m$ and a sub-circuit $MYG_m$, that are structurally and functionally identical to the sub-circuits $ABS_0$ and $MYG_0$.

The sub-circuit $MYG_m$ is configured to, on the basis of the values $b\tilde{x}_m[k]$ of a group of samples, determine here by performing a modified moving average of period L samples, the value of the following expression (formula XV)

$$\hat{p}_m[k-1] - \frac{\hat{p}_m[k-1]}{L} + \frac{|b\tilde{x}_m[k]|}{L} \quad \text{(XV)}$$

$\hat{p}_m[0]$ is taken equal to 0.

In these two formulae (XIV) and (XV) the number L can be for example chosen equal to a power of 2 so as to avoid the use of a divider, this division operation then being able to be performed through simple wiring.

A divider DIVm thereafter calculates the ratio between these two expressions to determine the inverse of the relative gain $\hat{g}_m[k]$ of the converter $ADC_m$ with respect to the converter $ADC_0$, associated with the current initial sample $b\tilde{x}_m[k]$ (formula XVI):

$$\frac{1}{\hat{g}_m[k]} = \left( \hat{p}_0[k-1] - \frac{\hat{p}_0[k-1]}{L} + \frac{|b\tilde{x}_0[k]|}{L} \right) / \left( \hat{p}_m[k-1] - \frac{\hat{p}_m[k-1]}{L} + \frac{|b\tilde{x}_m[k]|}{L} \right) \quad \text{(XVI)}$$

The second block $BLC20_m$ comprises circuitry configured to divide values of the samples of the train arising from the converter ADCm by the estimated relative gain. This circuitry is here a multiplier which multiplies the current initial sample $b\tilde{x}_m[k]$ by the inverse of the relative gain (formula XVII) to deliver the processed sample $\tilde{x}_m[k]$:

$$\hat{x}_m[k] = \tilde{x}_m[k] \times \frac{1}{\hat{g}_m[k]} \quad \text{(XVII)}$$

The processing module MT2 can also be embodied by an ASIC or else optionally in a software manner within a microprocessor, or else within an FPGA.

That said, the device DIS as a whole can be embodied within a single ASIC or single FPGA or else in a software manner within a single microprocessor.

FIGS. 22 to 25 illustrate simulation results obtained for a device of the type of that illustrated in FIG. 17, devoid however of the processing module MT3, since it is connected to a conversion structure with temporal interleaving whose temporally interleaved converters are not assumed to exhibit mismatch in terms of shift ("offset").

In the case of FIGS. 22 and 23, the analog signal is a signal having a single tone TN.

In each of FIGS. 22 to 25, the spectral power of the sampled signal has been represented as ordinate and the normalized frequency F/Fs as abscissa, where F denotes the frequency of the sampled signal.

In FIG. 22 it is seen that the sampled signal delivered as output from the converters $ADC_m$ exhibits before compensation in the device DIS, in addition to the tone TN, spurious tones.

After compensation (FIG. 23), the sampled signal delivered as output from the device DIS still exhibits the tone TN but, this time, the spurious spectral lines have been eliminated.

In the case of FIGS. 24 and 25, the input signal is a multi-tone signal possessing several useful tones $TN_i$.

Here again, it is seen that the sampled signal delivered by the converters exhibits, in addition to these tones $TN_i$ spurious frequency bands (FIG. 24).

Here again, after compensation by the device DIS, these spurious bands have been eliminated (FIG. 25).

What is claimed is:

1. A method for processing a sampled signal which comprises M original trains of original samples respectively arising from M temporally interleaved converters, M being greater than two, the method comprising a first processing which comprises:
    selecting an original train in as a reference train;
    for the M−1 other original trains, performing at least one estimation of a suite of M−1 shift coefficients that represent clock shifts between the M−1 other original trains and the reference train;
    wherein the at least one estimation comprises a correlation processing involving at least one part of the sampled signal, at least one part of at least one first signal gleaned from a derived signal representative of a temporal derivative of the sampled signal and at least one part of N partial filtered signals respectively representative of N weighted differences between N pairs of bracketing versions flanking the sampled signal, N being greater than or equal to 1, the at least one estimation also comprising a matrix processing on results of this correlation processing.

2. The method according to claim 1, wherein parts of the sampled signal, of the at least one first signal and of the filtered partial signal or signals on which the at least one correlation processing is performed, each comprise a group of L samples of the corresponding signal.

3. The method according to claim 1, wherein the correlation processing comprises a set of N first correlations between the at least one part of the at least one first signal and at least one part of N third signals respectively gleaned from the N partial filtered signals, delivering at least one set of N first results of correlations.

4. The method according to claim 3, wherein the parts of the third signals comprise L samples.

5. The method according to claim 1, wherein the at least one estimation comprises a calculation of a global filtered signal resulting from a sum of the N partial filtered signals, and the correlation processing comprises M second correlations between respectively the samples of the M original trains and corresponding samples of the global filtered signal, delivering M second correlation results.

6. The method according to claim 1, wherein each correlation of the correlation processing comprises an average of L products of samples.

7. The method according to claim 1, wherein the correlation processing delivers at least one set of N first correlation results and a set of M second correlation results and the matrix processing comprises a calculation of a final matrix of size (M−1)×M on based on at least one first constant circulant matrix and of the first correlation results and a multiplication of the M second correlation results with the coefficients of the final matrix, so as to obtain the suite of M−1 shift coefficients.

8. The method according to claim 7, wherein N is equal to 1 and the correlation processing delivers a single first correlation result obtained based on the train arising from a single converter, and the calculation of the final matrix comprises a calculation of an intermediate matrix based on a single first constant circulant matrix, a calculation of a pseudo-inverse matrix of the intermediate matrix and a weighting of the coefficients of the pseudo-inverse matrix with the first correlation result so as to obtain the coefficients of the final matrix.

9. The method according to claim 8, wherein the first constant circulant matrix is a matrix of size M×M whose coefficients are equal to 1 when a row index is equal to a column index, to −0.5 if the column index is equal to the row index plus or minus 1 modulo M and to 0 otherwise, wherein the intermediate matrix is the first constant circular matrix ridded of its first column, and the weighting of the coefficients of the pseudo inverse matrix comprises a division of these coefficients by the first correlation result so as to obtain the coefficients of the final matrix.

10. The method according to claim 7, wherein N is greater than 1 and the correlation processing delivers N first results obtained based on the train arising from a single converter, and the calculation of the final matrix comprises a calculation of an intermediate matrix based on a linear combination of N second constant circulant matrices respectively arising from N first constant circulant matrices, the combination being weighted by the N first correlation results, and a calculation of a pseudo-inverse matrix of the intermediate matrix, this pseudo-inverse matrix forming the final matrix.

11. The method according to claim 10, wherein each first constant circulant matrix of rank i, with i varying from 1 to N, is a matrix of size M×M
whose coefficients are all zero when i is equal to 0 modulo M, and
whose coefficients, when i is different from 0 modulo M, are equal to
1 if a row index is equal to a column index,
to −0.5 if the column index is equal to the row index plus or minus 1 modulo M, and
to 0 otherwise,
each second circulant matrix ($H_i$) being the first circulant matrix ($H'_i$) ridded of its first column.

12. The method according to claim 1, wherein the first processing furthermore comprises a correction processing of the M−1 other trains involving respectively M−1 second signals gleaned from the derived signal and the suite of M−1 shift coefficients, so as to deliver M processed trains including the reference original train and M−1 corrected original trains.

13. The method according to claim 12, wherein the first signal comprises the samples of the derived signal that are associated with one of the M trains and wherein the M−1 second signals respectively comprise the samples of the derived signal that are respectively associated with the M−1 other trains.

14. The method according to claim 13, wherein N third signals comprise samples of the N partial filtered signals associated with the one of the M trains, and the correlation processing comprises a single set of N first correlations between the at least one part of the first signal and the at least one part of the N third signals, delivering a single set of N first results of correlations.

15. The method according to claim 12, wherein the correction processing comprises a first-order Taylor approximation.

16. The method according to claim 1, wherein the first processing comprises several successive estimations so as to deliver several successive suites of M−1 shift coefficients.

17. The method according to claim 16, wherein the first processing further comprises a plurality of successive processings of corrections successively using estimated successive suites of M−1 shift coefficients.

18. The method according to claim 1, further comprising, before or after the first processing, performing a second processing comprising, after a transient phase, an equalization of mean powers of various initial trains of initial samples, performed on the fly and at the tempo of delivery of the samples, on the basis of the values of initial samples of these initial trains, so as to deliver processed trains of processed samples, an initial train being able to be a train delivered by a corresponding converter or else a train processed by the first processing.

19. The method according to claim 18, further comprising, before or after the first processing and before or after the second processing, a third processing comprising, after a transient phase, for each current primary sample of each primary train arising from the corresponding converter, a primary train being able to be a train delivered by the corresponding converter or a train processed by the first or the second processing,
a calculation of a digital correction word belonging to a pseudo-random sequence of digital words, the average of whose values is equal or almost equal to a value of the shift of the corresponding converter, estimated on the basis of the values of primary samples of the primary train arising from the corresponding converter, and
a subtraction of the digital correction word from a current intermediate sample obtained based on this current primary sample so as to deliver a corrected current sample.

20. The method according to claim 1, further comprising, before or after the first processing, a third processing comprising, after a transient phase, for each current primary sample of each primary train arising from a corresponding converter, a primary train being able to be a train delivered by the corresponding converter or a train processed by the first processing;
a calculation of a digital correction word belonging to a pseudo-random sequence of digital words, the average of whose values is equal or almost equal to a value of the shift of the corresponding converter, estimated on the basis of the values of primary samples of the primary train arising from the corresponding converter, and a subtraction of the digital correction word from a current intermediate sample obtained based on this current primary sample so as to deliver a corrected current sample.

21. A processing device, comprising:

an input configured to receive a sampled signal that comprises M original trains of original samples respectively arising from M analog/digital converters with temporal interleaving, M being greater than two, wherein one of the original trains is considered to be a reference train;

a first processing module comprising an estimation unit configured to perform, for the M−1 other original trains, at least one estimation of a suite of M−1 shift coefficients respectively representative of clock shifts between these M−1 other original trains and the reference train, wherein the estimation unit comprises a correlation unit configured to perform a correlation processing involving at least one part of the sampled signal, at least one part of at least one first signal gleaned from a derived signal representative of a temporal derivative of the sampled signal and at least one part of N partial filtered signals respectively representative of N weighted differences between N pairs of bracketing versions flanking the sampled signal, N being greater than or equal to 1; and wherein the estimation unit further comprises matrix processing unit configured to perform a matrix processing on results of this correlation processing.

22. The device according to claim 21, wherein parts of the sampled signal, of the at least one first signal and of the filtered partial signal or signals on which the at least one correlation processing is performed each comprise a group of L samples of a corresponding signal.

23. The device according to claim 21, wherein the correlation unit is configured to perform at least one set of N first correlations between the at least one part of the at least one first signal and at least one part of N third signals respectively gleaned from the N partial filtered signals, delivering at least one set of N first results of correlations.

24. The device according to claim 23, wherein the parts of the third signals comprise L samples.

25. The device according to claim 21, wherein the estimation unit is further configured to calculate a global filtered signal resulting from a sum of the N partial filtered signals, and the correlation unit is configured to perform M second correlations between respectively the samples of the M original trains and corresponding samples of the global filtered signal, delivering M second correlation results.

26. The device according to claim 21, wherein the correlation unit is configured to perform each correlation by using an average of L products of samples.

27. The device according to claim 26, wherein N is greater than 1 and the correlation unit is configured to deliver N first results obtained based on the train arising from a single converter, and the matrix processing unit is configured to calculate an intermediate matrix based on a linear combination of N second constant circulant matrices respectively arising from N first constant circulant matrices, the combination being weighted by the N first correlation results, and a pseudo-inverse matrix of the intermediate matrix, this pseudo-inverse matrix forming a final matrix.

28. The device according to claim 27, wherein each first constant circulant matrix of rank i, with i varying from 1 to N, is a matrix of size M×M whose coefficients are all zero when i is equal to 0 modulo M, and whose coefficients, when i is different from 0 modulo M, are equal to 1 if a row index is equal to a column index, to −0.5 if the column index is equal to the row index plus or minus 1 modulo M, and to 0 otherwise, each second circulant matrix being the first circulant matrix ridded of its first column.

29. The device according to claim 26, wherein N is equal to 1 and the correlation unit is configured to deliver a single first correlation result obtained based on the train arising from a single converter, and the matrix processing unit is configured to calculate an intermediate matrix based on a single first constant circulant matrix, a pseudo-inverse matrix of the intermediate matrix and to perform a weighting of the coefficients of the pseudo-inverse matrix with the first correlation result so as to obtain the coefficients of a final matrix.

30. The device according to claim 29, wherein the first constant circulant matrix is a matrix of size M×M whose coefficients are equal to 1 when a row index is equal to a column index, to −0.5 if the column index is equal to the row index plus or minus 1 modulo M and to 0 otherwise, the intermediate matrix is the first constant circular matrix ridded of its first column, and the matrix processing unit is configured to perform a division of these coefficients by the first correlation result so as to obtain the coefficients of the final matrix.

31. The device according to claim 21, wherein the correlation unit is configured to deliver at least one set of N first correlation results and a set of M second correlation results and the matrix processing unit is configured to calculate a final matrix of size (M−1)×M based on at least one first constant circulant matrix and of the first correlation results and to perform a multiplication of the M second correlation results with the coefficients of the final matrix, so as to obtain the suite of M−1 shift coefficients.

32. The device according to claim 21, wherein the first processing module further comprises a correction unit configured to perform at least one processing for correcting the M−1 other trains involving respectively M−1 second signals gleaned from the derived signal and the suite of M−1 shift coefficients, so as to deliver M processed trains including the reference original train and M−1 corrected original trains.

33. The device according to claim 32, wherein the first signal comprises the samples of the derived signal that are associated with one of the M trains and the M−1 second signals respectively comprise the samples of the derived signal that are respectively associated with the M−1 other trains.

34. The device according to claim 33, wherein N third signals comprise the samples of the N partial filtered signals associated with the one of the M trains, and the correlation unit is configured to perform a single set of N first correlations between the at least one part of the first signal and the at least one part of the N third signals, delivering a single set of N first results of correlations.

35. The device according to claim 32, wherein the estimation unit is configured to perform several successive estimations so as to deliver several successive suites of M−1 shift coefficients and wherein the correction unit is configured to perform a plurality of successive processings of corrections successively using the estimated successive suites of M−1 shift coefficients.

36. The device according to claim 32, wherein the correction unit is configured to perform a first-order Taylor approximation.

37. The device according to claim 21, wherein the estimation unit is configured to perform several successive estimations so as to deliver several successive suites of M−1 shift coefficients.

38. The device according to claim 21, further comprising a second processing module configured to perform before or after the first processing, a second processing comprising, after a transient phase, an equalization of mean powers of various initial trains of initial samples, performed on the fly and at the tempo of delivery of the samples, on the basis of the values of initial samples of these initial trains, so as to deliver processed trains of processed samples, an initial train being able to be a train arising from a corresponding converter or else a processed train delivered by the first processing module.

39. The device according to claim 38, further comprising a third processing module configured to perform, before or after the first processing and before or after the second processing, a third processing comprising, after a transient phase, for each current primary sample of each primary train arising from a corresponding converter, a primary train being able to be a train delivered by the corresponding converter or a processed train delivered by the first or the second processing module;
    a calculation of a digital correction word belonging to a pseudo-random sequence of digital words, the average of whose values is equal or almost equal to a value of the shift of the corresponding converter, estimated on the basis of values of primary samples of the primary train arising from the corresponding converter; and
    a subtraction of the digital correction word from a current intermediate sample obtained based on this current primary sample so as to deliver a corrected current sample.

40. The device according to claim 21, further comprising a third processing module configured to perform, before or after the first processing, a third processing comprising, after a transient phase, for each current primary sample of each primary train arising from a corresponding converter, a primary train being able to be a train delivered by the corresponding converter or a processed train delivered by the first processing module;
    a calculation of a digital correction word belonging to a pseudo-random sequence of digital words, the average of whose values is equal or almost equal to a value of the shift of the corresponding converter, estimated on the basis of values of primary samples of the primary train arising from the corresponding converter; and
    a subtraction of the digital correction word from a current intermediate sample obtained based on this current primary sample so as to deliver a corrected current sample.

* * * * *